United States Patent
Kim et al.

(10) Patent No.: US 7,390,749 B2
(45) Date of Patent: Jun. 24, 2008

(54) SELF-ALIGNED PITCH REDUCTION

(75) Inventors: Ji Soo Kim, Pleasanton, CA (US);
Sangheon Lee, Sunnyvale, CA (US);
Daehan Choi, Milpitas, CA (US); S. M. Reza Sadjadi, Saratoga, CA (US)

(73) Assignee: Lam Research Corporation, Fremont, CA (US)

( * ) Notice: Subject to any disclaimer, the term of this patent is extended or adjusted under 35 U.S.C. 154(b) by 41 days.

(21) Appl. No.: 11/558,238

(22) Filed: Nov. 9, 2006

(65) Prior Publication Data

US 2007/0122977 A1    May 31, 2007

Related U.S. Application Data

(63) Continuation-in-part of application No. 11/291,303, filed on Nov. 30, 2005.

(51) Int. Cl.
*H01L 21/311* (2006.01)

(52) U.S. Cl. ............ 438/702; 438/241; 438/275; 438/587; 438/737; 257/E21.691; 257/E21.683; 257/E21.66; 257/E21.678

(58) Field of Classification Search ........... 438/689, 438/700, 702, 703, 737, 738, 740, 743, 744, 438/241, 275, 587; 257/E21.683, E21.691, 257/E21.66, E21.678
See application file for complete search history.

(56) References Cited

U.S. PATENT DOCUMENTS

| | | | |
|---|---|---|---|
| 5,510,645 A * | 4/1996 | Fitch et al. | 257/522 |
| 6,232,214 B1 | 5/2001 | Lee et al. | |
| 6,297,125 B1 | 10/2001 | Nag et al. | |
| 6,605,541 B1 | 8/2003 | Yu | |
| 6,780,753 B2 | 8/2004 | Latchford et al. | |
| 6,781,192 B2 | 8/2004 | Farrar | |
| 6,858,153 B2 * | 2/2005 | Bjorkman et al. | 216/72 |
| 6,911,397 B2 * | 6/2005 | Jun et al. | 438/700 |
| 2003/0219988 A1 | 11/2003 | Shan et al. | |
| 2003/0232474 A1 * | 12/2003 | Lai et al. | 438/301 |
| 2003/0232509 A1 | 12/2003 | Chung et al. | |
| 2004/0002217 A1 * | 1/2004 | Mazur et al. | 438/696 |
| 2004/0072430 A1 | 4/2004 | Huang et al. | |
| 2004/0126705 A1 | 7/2004 | Lu et al. | |
| 2005/0110145 A1 | 5/2005 | Elers | |

(Continued)

OTHER PUBLICATIONS

International Search Report dated Mar. 27, 2007 from related International Application No. PCT/US2006/044521.

(Continued)

*Primary Examiner*—George Fourson
*Assistant Examiner*—John M Parker
(74) *Attorney, Agent, or Firm*—Beyer Law Group LLP

(57) ABSTRACT

A method for providing features in an etch layer with a memory region and a peripheral region is provided. A memory patterned mask is formed over a first sacrificial layer. A first set of sacrificial layer features is etched into the first sacrificial layer and a second sacrificial layer. Features of the first set of sacrificial layer features are filled with filler material. The first sacrificial layer is removed. The spaces are shrunk with a shrink sidewall deposition. A second set of sacrificial layer features is etched into the second sacrificial layer. The filler material and shrink sidewall deposition are removed. A peripheral patterned mask is formed over the memory region and peripheral region. The second sacrificial layer is etched through the peripheral patterned mask. The peripheral patterned mask is removed. Features are etched into the etch layer from the second sacrificial layer.

19 Claims, 23 Drawing Sheets

U.S. PATENT DOCUMENTS

2006/0160353 A1 * 7/2006 Gueneau de Mussy et al. ............ 438/624
2007/0123016 A1   5/2007 Sadjadi et al.
2007/0123017 A1   5/2007 Sadjadi et al.
2007/0123053 A1   5/2007 Kim et al.

OTHER PUBLICATIONS

Written Opinion dated Mar. 27, 2007 from related International Application No. PCT/US2006/044521.

International Search Report dated Apr. 24, 2007 from corresponding International Application No. PCT/US2006/044708.

Written Opinion dated Apr. 24, 2007 from corresponding International Application No. PCT/US2006/044708.

International Search Report dated Mar. 20, 2007 from related International Application No. PCT/US2006/044719.

Written Opinion dated Mar. 20, 2007 from related International Application No. PCT/US2006/044719.

* cited by examiner

SELF-ALIGNED PITCH REDUCTION

RELATED APPLICATIONS

This application is a continuation-in-part of and claims priority to U.S. patent application No. Ser. No. 11/291,303 entitled "Self-Aligned Pitch Reduction," by Kim et al. filed Nov. 30, 2005, which is hereby incorporated by reference.

BACKGROUND OF THE INVENTION

The present invention relates to the formation of semiconductor devices.

During semiconductor wafer processing, features of the semiconductor device are defined in the wafer using well-known patterning and etching processes. In these processes, a photoresist (PR) material is deposited on the wafer and then is exposed to light filtered by a reticle. The reticle is generally a glass plate that is patterned with exemplary feature geometries that block light from propagating through the reticle.

After passing through the reticle, the light contacts the surface of the photoresist material. The light changes the chemical composition of the photoresist material such that a developer can remove a portion of the photoresist material. In the case of positive photoresist materials, the exposed regions are removed, and in the case of negative photoresist materials, the unexposed regions are removed. Thereafter, the wafer is etched to remove the underlying material from the areas that are no longer protected by the photoresist material, and thereby define the desired features in the wafer Various generations of photoresist are known. The photoresist patterns have a critical dimension (CD), which may be the width of the smallest feature. Due to optical properties dependent on wavelength, photoresist exposed by longer wavelength light has larger theoretical minimal critical dimensions. Features are etched through the photoresist pattern. Ideally, the CD of the features (the width of the features) is equal to the CD of the feature in the photoresist. In practice, the CD of the feature may be larger than the CD of the photoresist due to faceting, erosion of the photoresist, or undercutting. The feature may also be tapered, where the CD of the feature is at least as great as the CD of the photoresist, but where the feature tapers to have a smaller width near the feature bottom. Such tapering may provide unreliable features.

In order to provide features with smaller CD, features formed using shorter wavelength light are being pursued. 193 nm photoresist is exposed by 193 nm light. Using phase shift reticles and other technology, a 90-100 nm CD photoresist pattern may be formed, using 193 nm photoresist. This would be able to provide a feature with a CD of 90-100 nm. 157 nm photoresist is exposed by 157 nm light. Using phase shift reticles and other technology, sub 90 nm CD photoresist patterns may be formed. This would be able to provide a feature with a sub 90 nm CD The use of shorter wavelength photoresists may provide additional problems over photoresists using longer wavelengths. To obtain CD's close to the theoretical limit the lithography apparatus should be more precise, which would require more expensive lithography equipment. Presently 193 nm photoresist and 157 nm photoresist may not have selectivities as high as longer wavelength photoresists and may more easily deform under plasma etch conditions.

In the etching of conductive layers, such as in the formation of memory devices, it is desirable to increase device density.

SUMMARY OF THE INVENTION

To achieve the foregoing and in accordance with the purpose of the present invention, a method for providing features in an etch layer with a memory region and a peripheral region, where a density of features in the memory region is at least twice a density of features in the peripheral region is provided. First and second sacrificial layers are formed over the etch layer. A memory patterned mask is formed over the sacrificial layer, where the memory patterned mask provides features over memory region. A first set of sacrificial layer features is etched into the first sacrificial layer and the second sacrificial layer, where the first set of sacrificial layer features is in the memory region. Features of the first set of sacrificial layer features are filled with filler material. The first sacrificial layer is removed, so that parts of the filler material remain exposed above a surface of the second sacrificial layer, wherein spaces are between the exposed parts of the filler material, where the spaces are in an area formerly occupied by the first sacrificial layer, wherein the spaces have widths. The widths of the spaces between the parts of the filler material are shrunk with a shrink sidewall deposition where the shrink sidewall deposition provides a deposition over the memory region. A second set of sacrificial layer features is etched into the second sacrificial layer through the shrink sidewall deposition, where the second set of sacrificial layer features are only in the memory region and not in the peripheral region. The filler material and shrink sidewall deposition are removed. A peripheral patterned mask is formed over the memory region and peripheral region, where features are provided over the peripheral region. The second sacrificial layer is etched through the peripheral patterned mask, wherein features are etched into the second sacrificial layer in the peripheral region. The peripheral patterned mask is removed. Features are etched into the etch layer from the second sacrificial layer.

In another manifestation of the invention, a method for providing features in an etch layer with a memory region and a peripheral region, where a density of features in the memory region is at least twice a density of features in the peripheral region is provided. First and second sacrificial layers are formed over the etch layer. A memory patterned mask is formed over the sacrificial layer, where the memory patterned mask provides features over memory region and does not provide features over the peripheral region. A first set of sacrificial layer features is etched into the first sacrificial layer and the second sacrificial layer, where the first set of sacrificial layer features is in the memory region. Features of the first set of sacrificial layer features are filled with filler material. The first sacrificial layer is removed, so that parts of the filler material remain exposed above a surface of the second sacrificial layer, wherein spaces are between the exposed parts of the filler material, where the spaces are in an area formerly occupied by the first sacrificial layer, wherein the spaces have widths. The widths of the spaces between the parts of the filler material are shrunk with a shrink sidewall deposition where the shrink sidewall deposition provides a deposition over the memory region, wherein the shrinking the widths of the spaces comprises at least two shrink cycles, wherein each shrink cycle comprises a shrink deposition phase, which forms deposits on sidewalls of the filler material to shrink the spaces and a shrink profile shaping phase, which shapes the deposition on the sidewalls of the filler material. A second set of sacrificial layer features is etched into the second sacrificial layer through the shrink sidewall deposition, where the second set of sacrificial layer features are only in the memory region and not in the peripheral region. The filler material and shrink sidewall deposition are removed. A peripheral patterned mask is formed over the memory region and peripheral region, where features are provided over the peripheral region and where features are not provided over the memory region. The second sacrificial layer is etched through the peripheral patterned mask, wherein features are etched into the second sacrificial layer in the peripheral region. The peripheral patterned mask is removed. Features are etched into the etch layer from the second sacrificial layer.

In another manifestation of the invention, a method for providing features in an etch layer with a memory region and a peripheral region, where a density of features in the memory region is at least twice a density of features in the peripheral region is provided. First and second sacrificial layers are formed over the etch layer. A memory patterned mask is formed over the sacrificial layer, where the memory patterned mask provides features over memory region and does not provide features over the peripheral region. The features are etched into the first sacrificial layer. The features etched into the first sacrificial layer are shrunk with a shrink deposition. The first set of sacrificial layer features is etched into the second sacrificial layer through the shrink deposition. Features of the first set of sacrificial layer features are filled with filler material. The first sacrificial layer is removed, so that parts of the filler material remain exposed above a surface of the second sacrificial layer, wherein spaces are between the exposed parts of the filler material, where the spaces are in an area formerly occupied by the first sacrificial layer, wherein the spaces have widths. The widths of the spaces between the parts of the filler material are shrunk with a shrink sidewall deposition where the shrink sidewall deposition provides a deposition over the memory region, wherein the shrinking the widths of the spaces comprises at least two shrink cycles, wherein each shrink cycle comprises a shrink deposition phase, which forms deposits on sidewalls of the filler material to shrink the spaces, and a shrink profile shaping phase, which shapes the deposition on the sidewalls of the filler material. A second set of sacrificial layer features is etched into the second sacrificial layer through the shrink sidewall deposition, where the second set of sacrificial layer features are only in the memory region and not in the peripheral region. The filler material and shrink sidewall deposition are removed. A peripheral patterned mask is formed over the memory region and peripheral region, where features are provided over the peripheral region and where features are not provided over the memory region. The second sacrificial layer is etched through the peripheral patterned mask, wherein features are etched into the second sacrificial layer in the peripheral region. The peripheral patterned mask is removed. Features are etched into the etch layer from the second sacrificial layer.

These and other features of the present invention will be described in more detail below in the detailed description of the invention and in conjunction with the following figures.

BRIEF DESCRIPTION OF THE DRAWINGS

The present invention is illustrated by way of example, and not by way of limitation, in the figures of the accompanying drawings and in which like reference numerals refer to similar elements and in which.

DETAILED DESCRIPTION OF THE PREFERRED EMBODIMENTS

The present invention will now be described in detail with reference to a few preferred embodiments thereof as illustrated in the accompanying drawings. In the following description, numerous specific details are set forth in order to provide a thorough understanding of the present invention. It will be apparent, however, to one skilled in the art, that the present invention may be practiced without some or all of these specific details. In other instances, well known process steps and/or structures have not been described in detail in order to not unnecessarily obscure the present invention.

Figure 1:
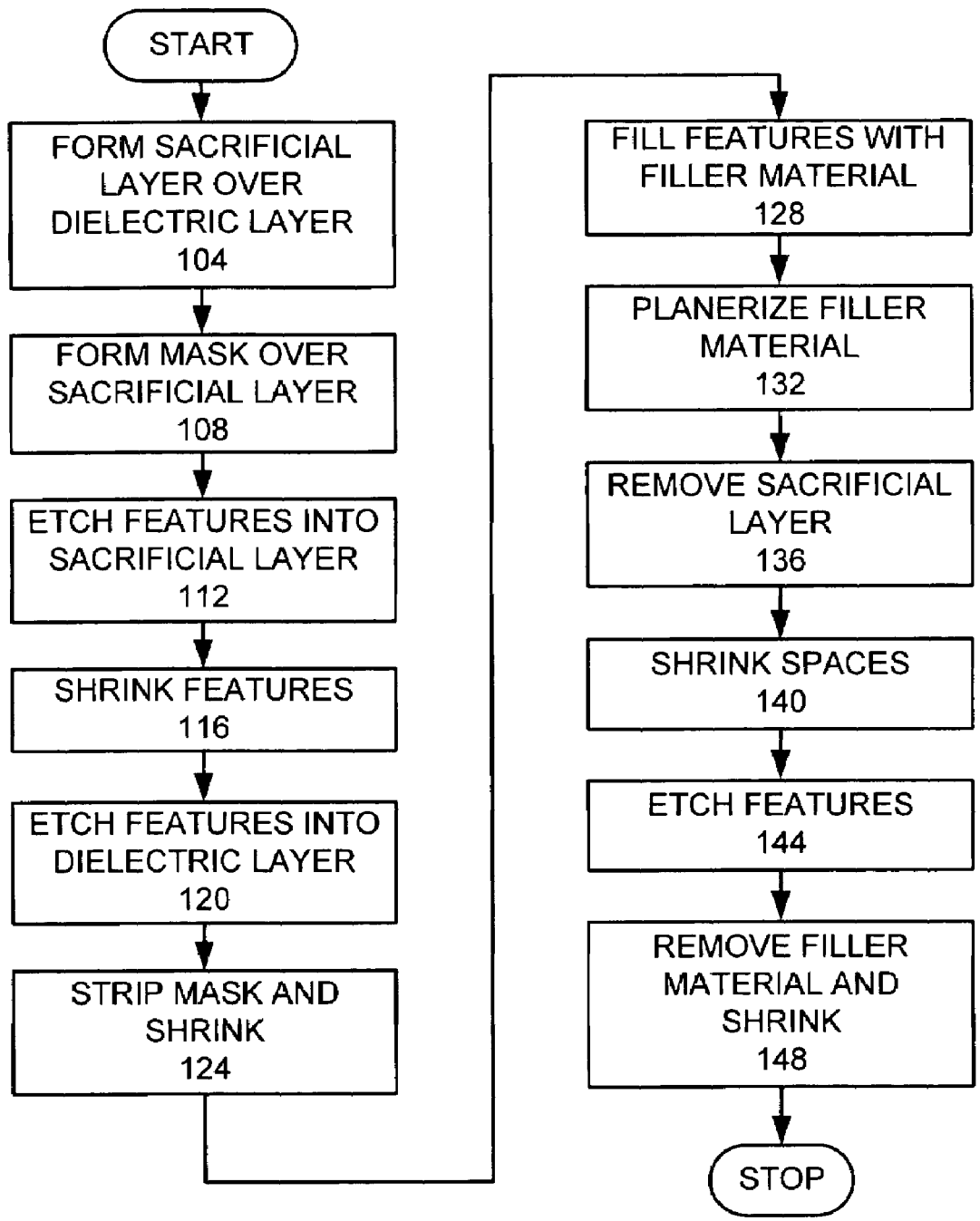
FIG. 1 is a flow chart of a process that may be used in an embodiment of the invention.
Figure 2A:
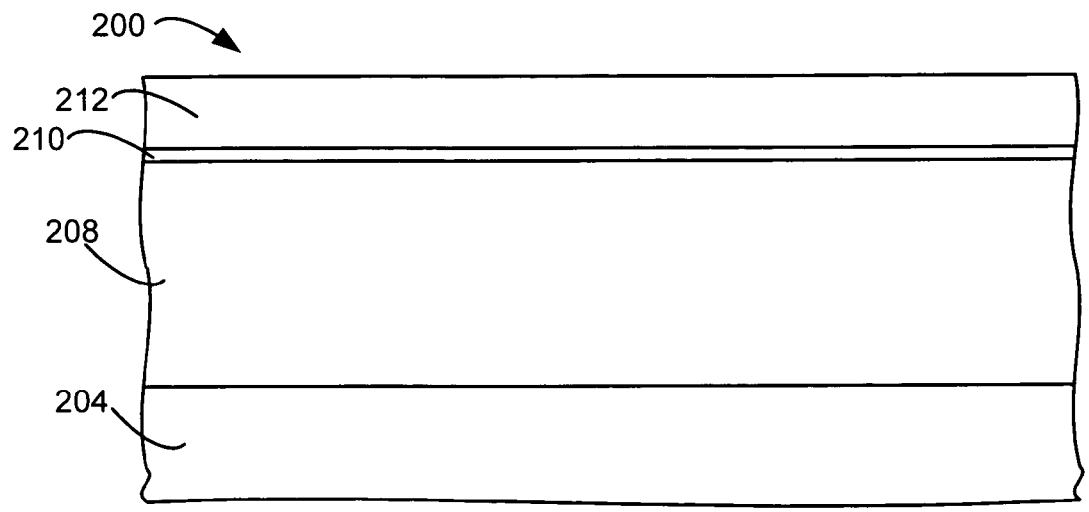
FIGS. 2A-L are schematic cross-sectional and top views of a stack processed according to an embodiment of the invention.

To facilitate understanding, FIG. 1 is a flow chart of a process that may be used in an embodiment of the invention. A sacrificial layer is formed over a dielectric layer (step 104). FIG. 2A is a cross-sectional view of a sacrificial layer 212 formed over a dielectric layer 208, which is over a substrate 204 forming a stack 200. In this example, the substrate 204 is a silicon wafer. An etch stop layer 210 is disposed between the sacrificial layer 212 and dielectric layer 208. In this example, the etch stop layer 210 is at least one of a nitride and silicon carbide. In other examples, the etch stop layer 210 may be of other materials. The dielectric layer 208 is a low-k dielectric, such as organosilicate glass. In this embodiment, the sacrificial layer is silicon oxide. In other embodiments the sacrificial layer is one of SiC, SiN, SiOC, H doped SiOC, TiN, TaN, Ti, Ta, Si, and $SiO_2$. More generally, the sacrificial layer is any material that may be selectively etched or removed with respect to the filling material, described below.

Figure 2B:
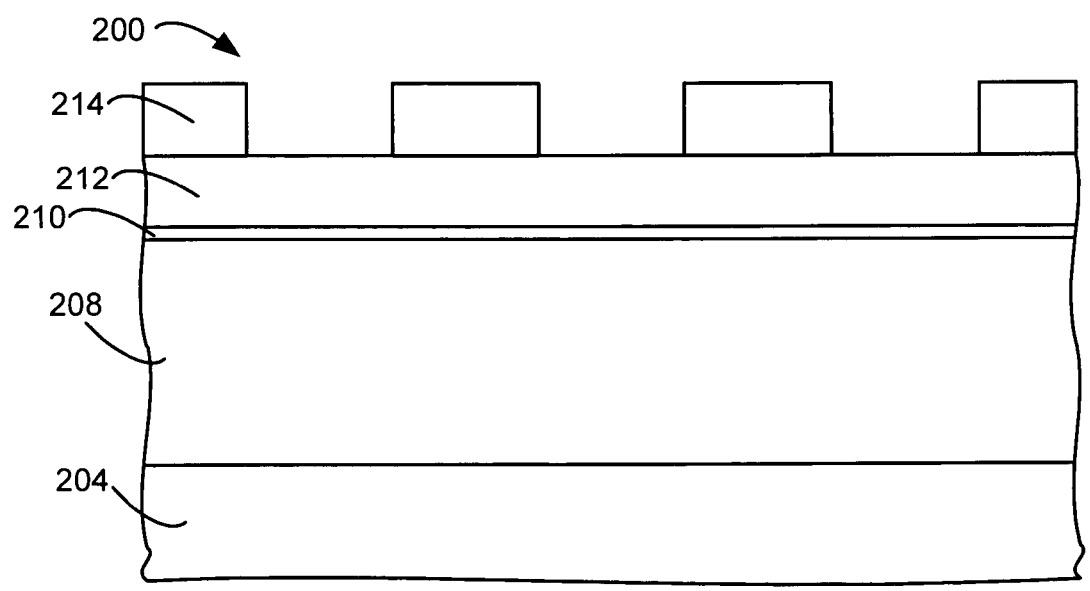
Figure 2C:
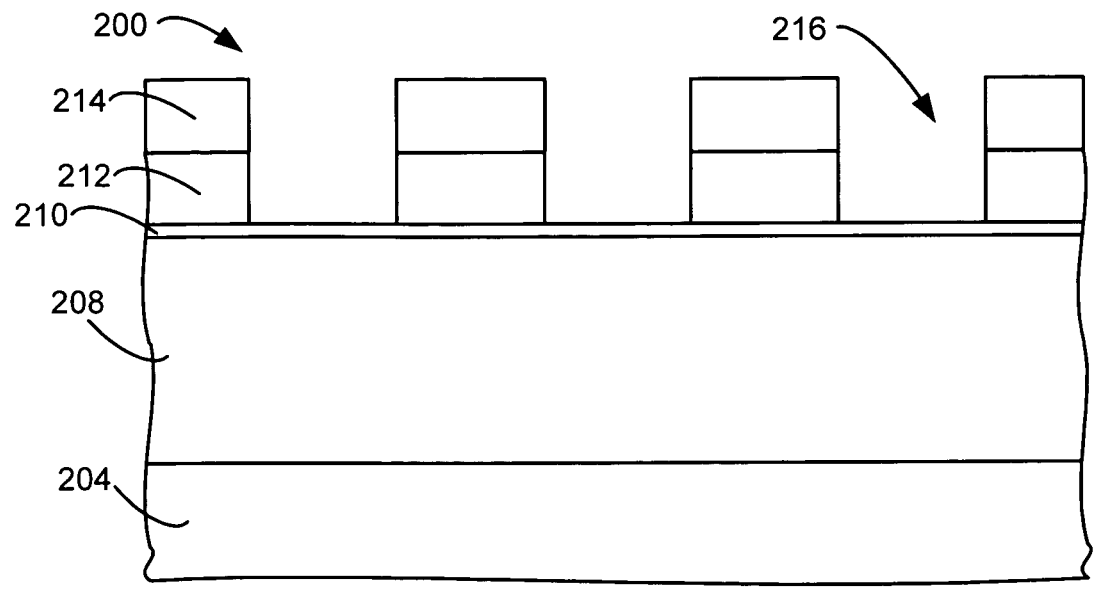
Figure 2D:
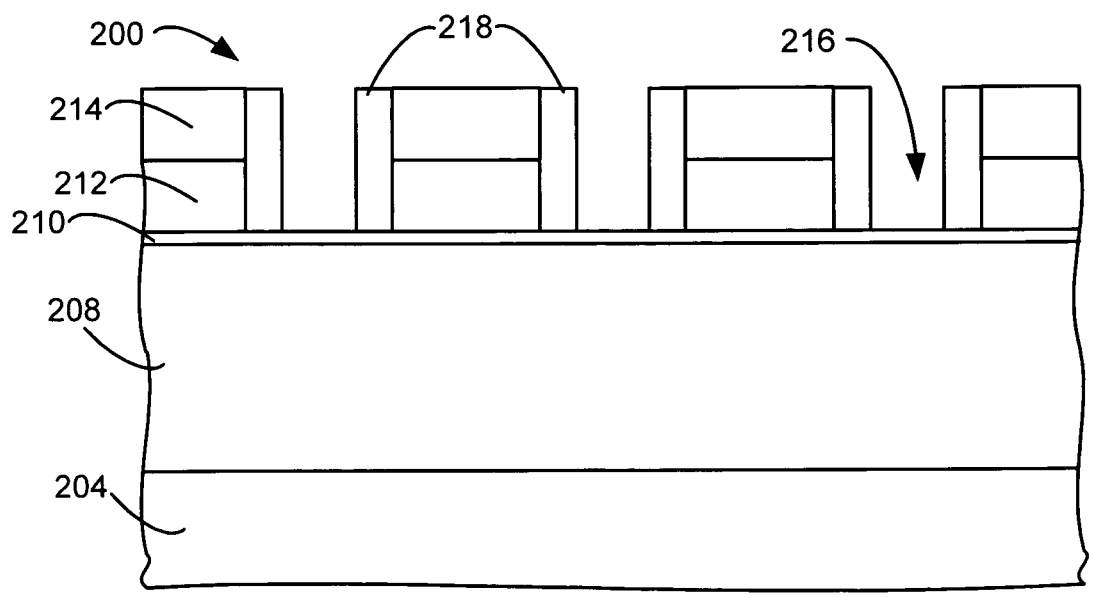

A mask 214 is formed over the sacrificial layer (step 108), as shown in FIG. 2B. Preferably, the mask 214 is of a photoresist material. Sacrificial layer features 216 are etched into the sacrificial layer 212 (step 112), as shown in FIG. 2C. The etch stop layer 210 allows the etching of the sacrificial layer features 216 to the sacrificial layer 212, without etching the dielectric layer 208. After etching the features 216 into the sacrificial layer 212, a shrink process is used to shrink widths of the features 216 in the sacrificial layer 212 by forming sacrificial layer shrink sidewalls 218, as shown in FIG. 2D.

Figure 4:
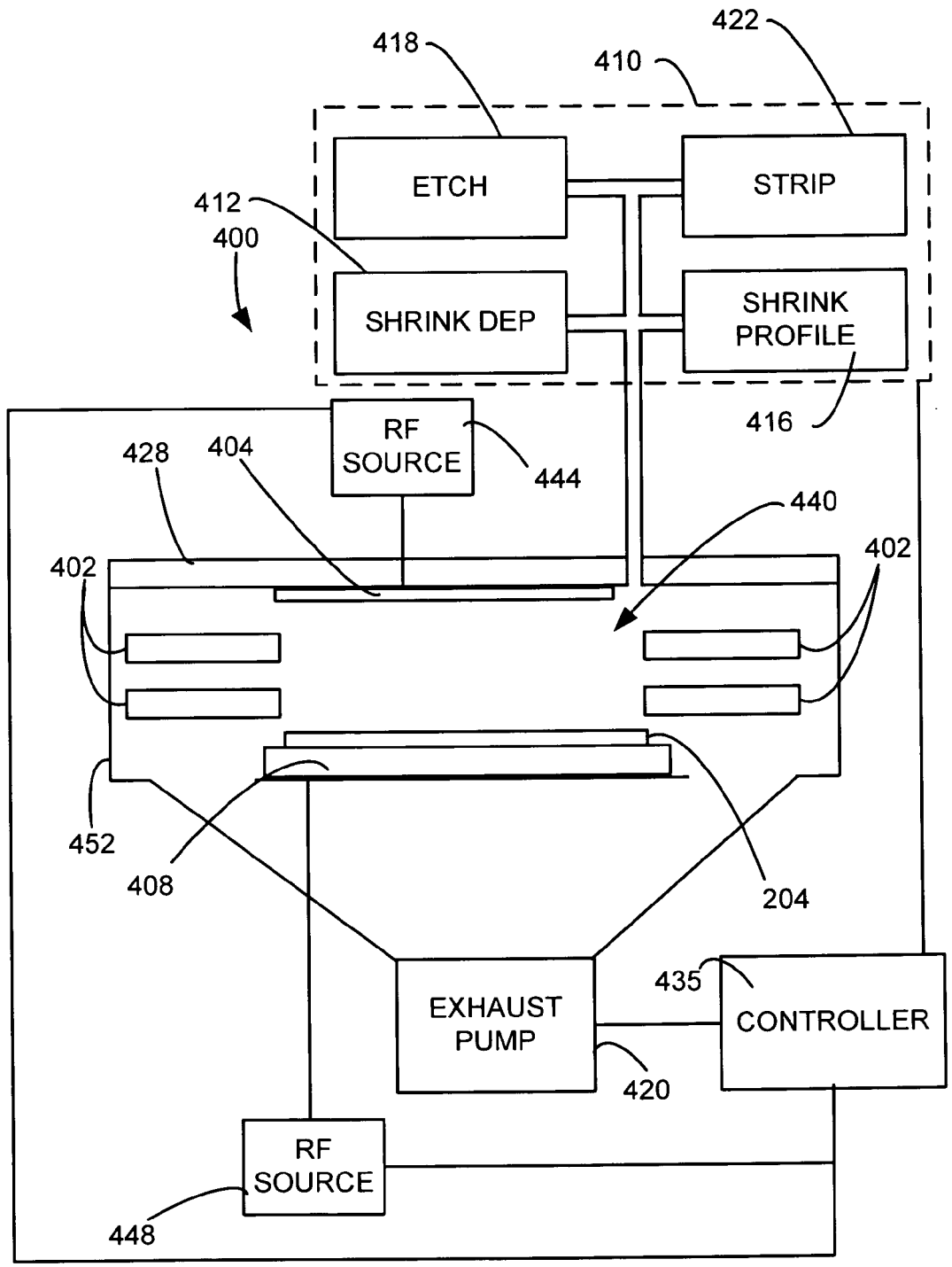
FIG. 4 is a schematic view of a plasma processing chamber that may be used in practicing the invention.

FIG. 4 is a schematic view of a processing chamber 400 that may be used to form the shrink sidewalls. The plasma processing chamber 400 comprises confinement rings 402, an upper electrode 404, a lower electrode 408, a gas source 410, and an exhaust pump 420. The gas source 410 comprises a shrink deposition gas source 412 and a shrink profile gas source 416. The gas source may comprise additional gas sources such as an etch gas source 418 and a stripping gas source 422 to allow etching, stripping, and other processes to be performed in the same chamber. Within plasma processing chamber 400, the substrate 204 is positioned upon the lower electrode 408. The lower electrode 408 incorporates a suitable substrate chucking mechanism (e.g., electrostatic, mechanical clamping, or the like) for holding the substrate 204. The reactor top 428 incorporates the upper electrode 404 disposed immediately opposite the lower electrode 408. The upper electrode 404, lower electrode 408, and confinement rings 402 define the confined plasma volume. Gas is supplied to the confined plasma volume by the gas source 410 and is exhausted from the confined plasma volume through the confinement rings 402 and an exhaust port by the exhaust pump 420. A first RF source 444 is electrically connected to the upper electrode 404. A second RF source 448 is electrically connected to the lower electrode 408. Chamber walls 452 surround the confinement rings 402, the upper electrode 404, and the lower electrode 408. Both the first RF source 444 and the second RF source 448 may comprise a 27 MHz power source and a 2 MHz power source. Different combinations of connecting RF power to the electrode are possible. In the case of Lam Research Corporation's Dual Frequency Capacitive (DFC) System, made by LAM Research Corporation™ of Fremont, Calif., which may be used in a preferred embodiment of the invention, both the 27 MHz and 2 MHz power sources make up the second RF power source 448 connected to the lower electrode, and the upper electrode is grounded. In other embodiments, the RF power source may have a frequency up to 300 MHz. A controller 435 is controllably connected to the RF sources 444, 448, exhaust pump 420, and the gas source 410. The DFC System would be used when the layer to be etched 208 is a dielectric layer, such as silicon oxide or organo silicate glass.

Figure 5A:
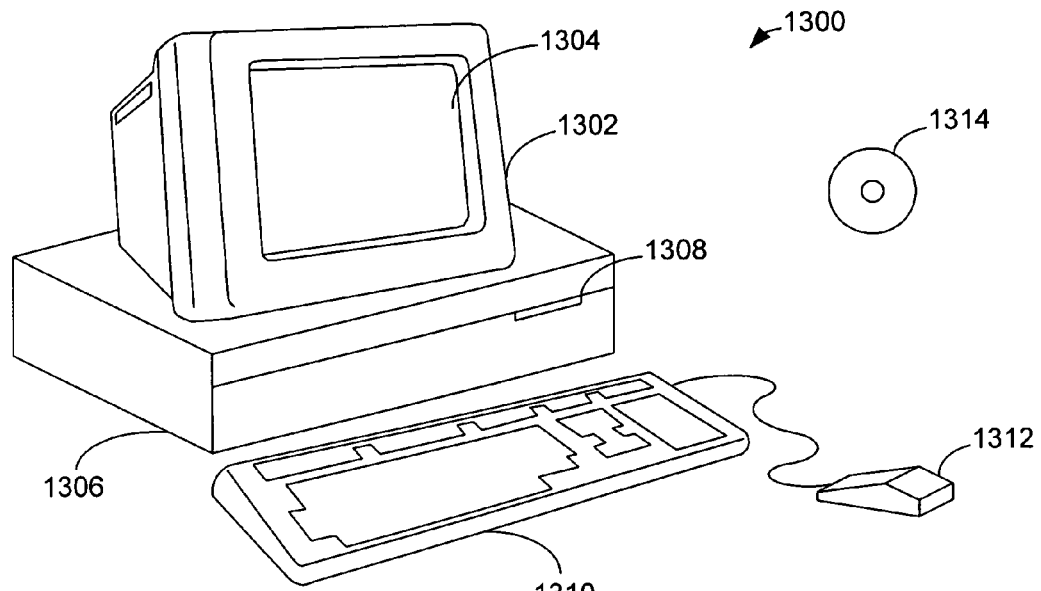
FIGS. 5A-B illustrate a computer system, which is suitable for implementing a controller used in embodiments of the present invention.
Figure 5B:
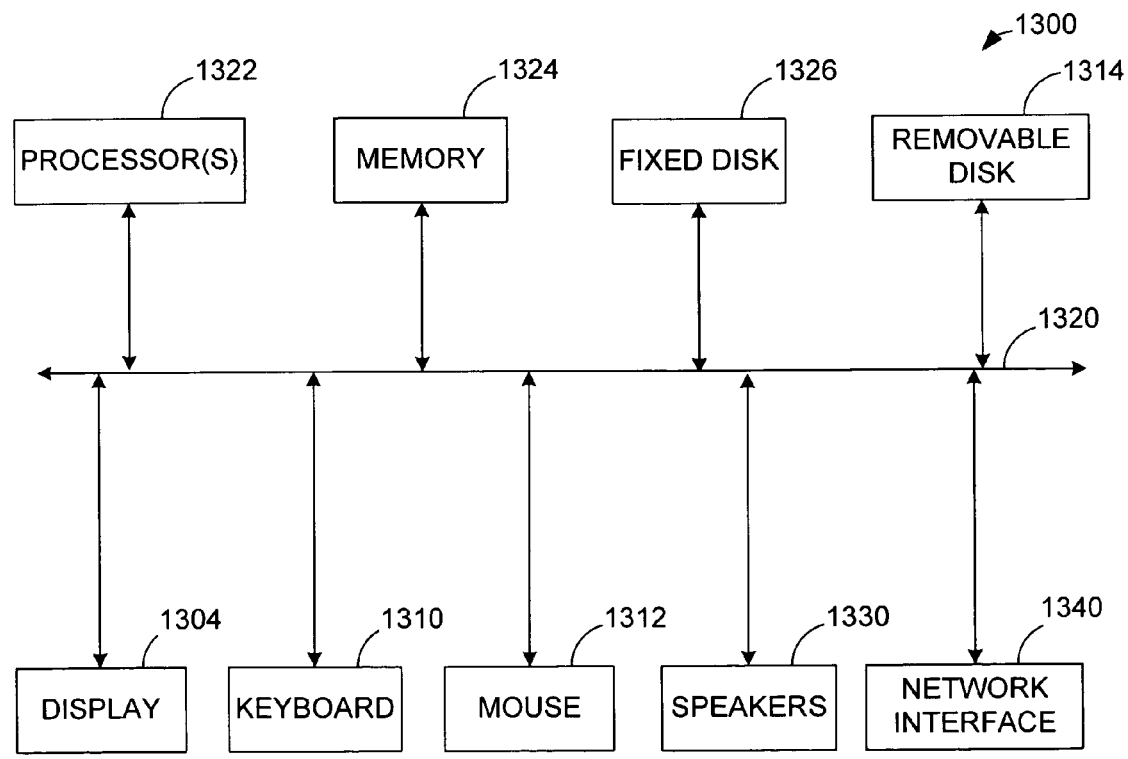

FIGS. 5A and 5B illustrate a computer system 1300, which is suitable for implementing a controller 435 used in embodiments of the present invention. FIG. 5A shows one possible physical form of the computer system. Of course, the computer system may have many physical forms ranging from an integrated circuit, a printed circuit board, and a small handheld device up to a huge super computer. Computer system 1300 includes a monitor 1302, a display 1304, a housing 1306, a disk drive 1308, a keyboard 1310, and a mouse 1312. Disk 1314 is a computer-readable medium used to transfer data to and from computer system 1300.

FIG. 5B is an example of a block diagram for computer system 1300. Attached to system bus 1320 is a wide variety of subsystems. Processor(s) 1322 (also referred to as central processing units, or CPUs) are coupled to storage devices, including memory 1324. Memory 1324 includes random access memory (RAM) and read-only memory (ROM). As is well known in the art, ROM acts to transfer data and instructions uni-directionally to the CPU and RAM is used typically to transfer data and instructions in a bi-directional manner. Both of these types of memories may include any suitable of the computer-readable media described below. A fixed disk 1326 is also coupled bi-directionally to CPU 1322; it provides additional data storage capacity and may also include any of the computer-readable media described below. Fixed disk 1326 may be used to store programs, data, and the like and is typically a secondary storage medium (such as a hard disk) that is slower than primary storage. It will be appreciated that the information retained within fixed disk 1326 may, in appropriate cases, be incorporated in standard fashion as virtual memory in memory 1324. Removable disk 1314 may take the form of any of the computer-readable media described below.

CPU 1322 is also coupled to a variety of input/output devices, such as display 1304, keyboard 1310, mouse 1312, and speakers 1330. In general, an input/output device may be any of: video displays, track balls, mice, keyboards, microphones, touch-sensitive displays, transducer card readers, magnetic or paper tape readers, tablets, styluses, voice or handwriting recognizers, biometrics readers, or other computers. CPU 1322 optionally may be coupled to another computer or telecommunications network using network interface 1340. With such a network interface, it is contemplated that the CPU might receive information from the network, or might output information to the network in the course of performing the above-described method steps. Furthermore, method embodiments of the present invention may execute solely upon CPU 1322 or may execute over a network such as the Internet in conjunction with a remote CPU that shares a portion of the processing.

In addition, embodiments of the present invention further relate to computer storage products with a computer-readable medium that have computer code thereon for performing various computer-implemented operations. The media and computer code may be those specially designed and constructed for the purposes of the present invention, or they may be of the kind well known and available to those having skill in the computer software arts. Examples of computer-readable media include, but are not limited to: magnetic media such as hard disks, floppy disks, and magnetic tape; optical media such as CD-ROMs and holographic devices; magneto-optical media such as floptical disks; and hardware devices that are specially configured to store and execute program code, such as application-specific integrated circuits (ASICs), programmable logic devices (PLDs) and ROM and RAM devices. Examples of computer code include machine code, such as produced by a compiler, and files containing higher level code that are executed by a computer using an interpreter. Computer readable media may also be computer code transmitted by a computer data signal embodied in a carrier wave and representing a sequence of instructions that are executable by a processor.

Figure 3:
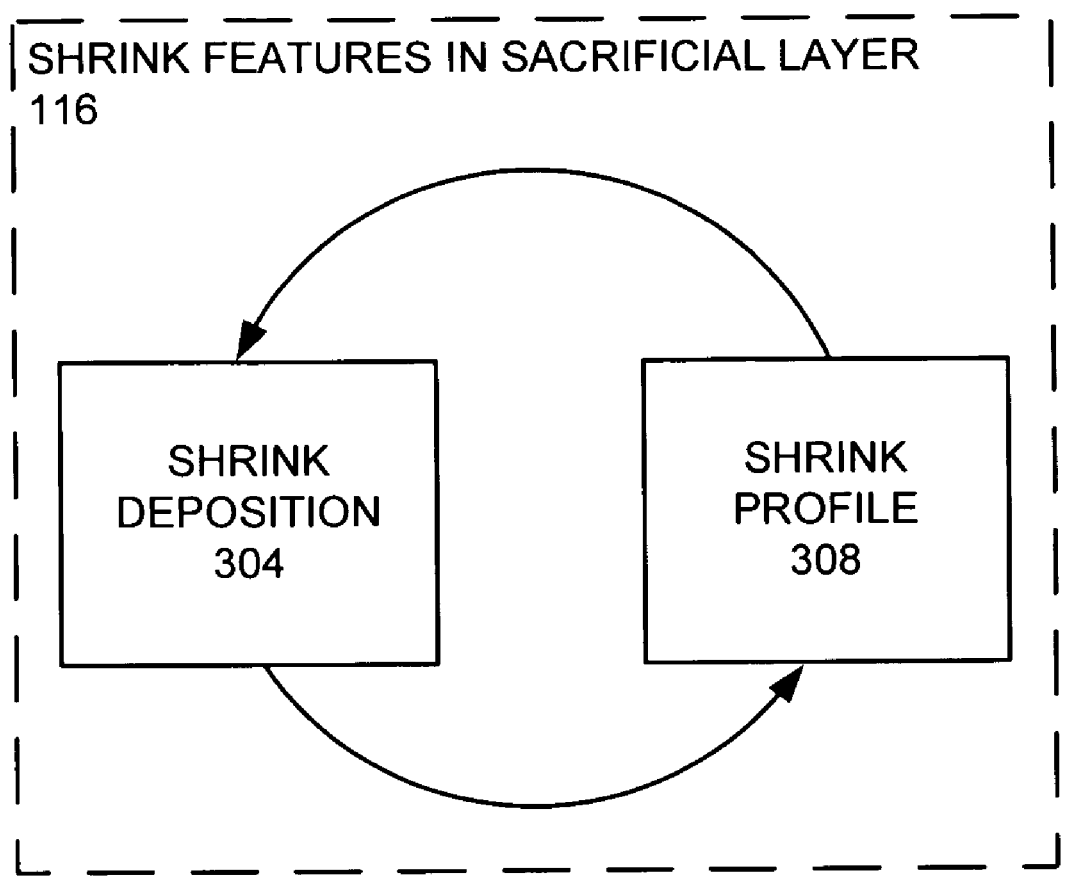
FIG. 3 is a more detailed flow of a step of shrinking features.

FIG. 3 is a more detailed flow chart of the step of shrinking the widths of the features in the sacrificial layer (step 116). As shown in FIG. 3, the shrinking the features comprises a plurality of cycles of a cyclic process comprising a shrink deposition phase (step 304) and profile shaping phase (step 308).

Preferably, the shrink deposition phase (step 304) uses a deposition gas comprising at least one of a combination of $CF_4$ and $H_2$ or a combination of $CH_3F$ and $N_2$ or $C_xF_y$ or $C_xH_yF_z$ with an oxidizing or reducing additive such as hydrogen, nitrogen, or oxygen, and carrier gases such as He, Ar, Ne, Kr, Xe etc. More generally, the deposition gas comprises at least one of hydrocarbon, fluorocarbon, and hydrofluorocarbon. More preferably, the deposition gas further comprises a carrier gas, such as argon or xenon. More preferably, the deposition gas further comprises at least one of an oxidizing additive and a reducing additive, such as $O_2$, $H_2$, or $NH_3$.

An example of a shrink deposition phase (step 304) provides a flow of 150 sccm $CH_3F$, 75 sccm $N_2$, and 100 sccm Ar. The pressure is set to 80 mTorr. The substrate is maintained at a temperature of 20° C. The second RF source 448 provides 400 Watts at a frequency of 27 MHz and 0 Watts a frequency of 2 MHz. During the deposition phase the deposition gas is provided, the deposition gas is transformed into a plasma, and then the deposition gas is stopped.

Preferably, the shrink profile shaping stage uses a profile shaping gas different from the deposition gas and comprising at least one of $C_xF_y$ and $NF_3$ and $C_xH_yF_z$. More preferably, the profile shaping gas further comprises a carrier gas, such as argon or xenon. More preferably, the profile shaping gas further comprises at least one of an oxidizing additive and a reducing additive, such as $O_2$, $H_2$, or $NH_3$.

An example of the shrink profile shaping phase (step 308) provides a halogen (i.e. fluorine, bromine, chlorine) containing gas, such as 100 sccm $CF_4$. In this example, $CF_4$ is the only gas provided during the profile shaping. A pressure of 20 mTorr is provided to the chamber. The second RF source 448 provides 600 Watts at a frequency of 27 MHz and 0 Watts a frequency of 2 MHz. During the profile shaping phase the profile shaping gas is provided, the profile shaping gas is transformed into a plasma, and then the profile shaping gas is stopped.

Preferably, the process is performed for between 2 to 20 cycles. More preferably, the process is performed between 3 to 10 cycles. The combination of deposition and profile shaping over a plurality of cycles allows for the formation of vertical sidewalls for the shrink. Preferably, the vertical sidewalls are sidewalls that from bottom to top make an angle between 88° to 90° with the bottom of the sacrificial layer feature.

Preferably, the shrink sidewalls cause widths of the sacrificial layer features to be reduced by between 5-80%. More preferably, the shrink sidewalls cause the widths of the sacrificial layer features to be reduced by between 5-50%. The cyclical cycle may have additional deposition and/or shaping phases or may have other additional phases.

In another embodiment, the shrink may be made of features in the photoresist mask before the sacrificial layer is etched. In such a case, the etching of the sacrificial layer and the dielectric layer may be done in a single step or in separate steps.

Figure 2E:
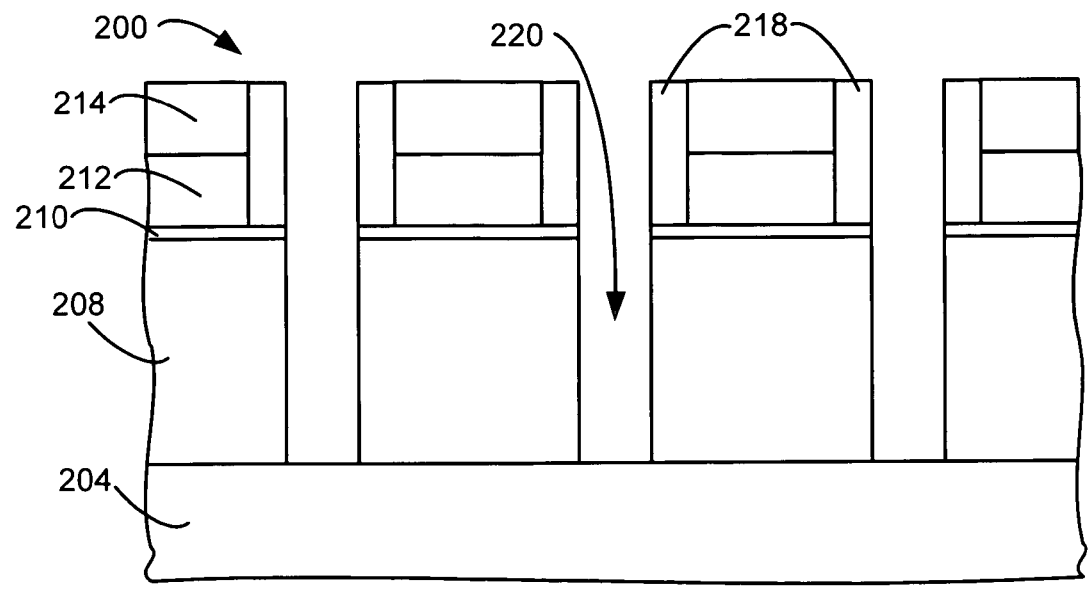

Features 220 of a first set of features are then etched into the dielectric layer 208 through the shrunken features in the sacrificial layer and patterned mask 214 the (the step 120), as shown in FIG. 2E. A conventional dielectric etch is used.

Figure 2F:
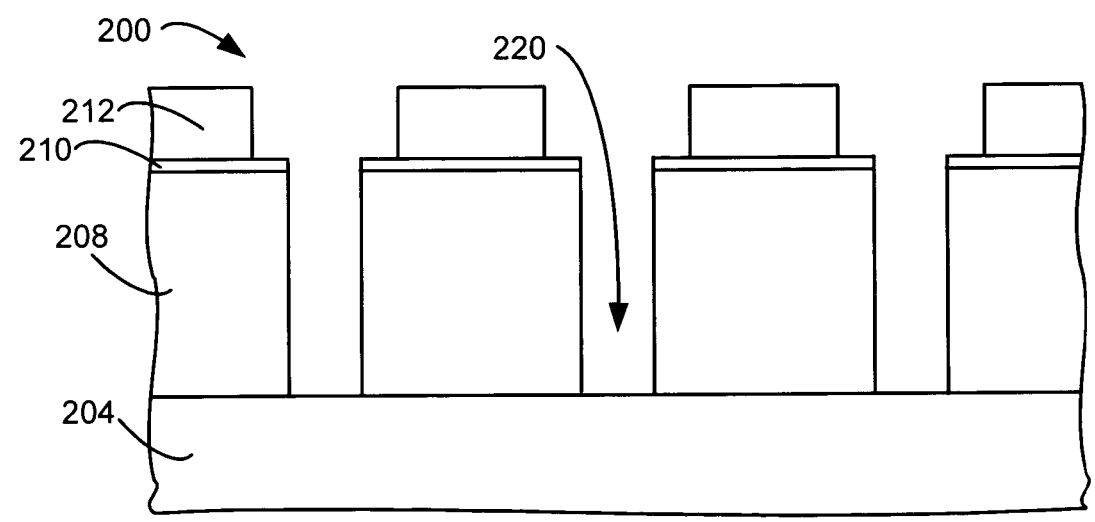

The patterned mask and shrink sidewall is stripped (step 124), as shown in FIG. 2F. The removal of the mask and shrink sidewall may be a single step or multiple step process. An ashing process may be used during this step.

Figure 2G:
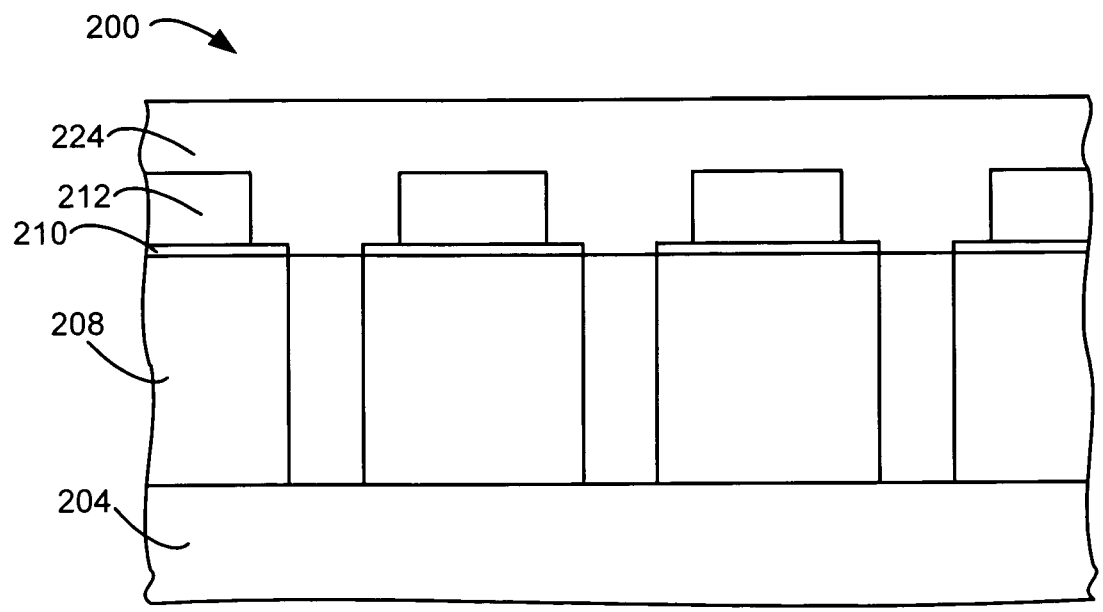

The features are then filled with a filler material 224 (step 128), as shown in FIG. 2G. In this embodiment the filler material is a polymer material, such as photoresist, hydrocarbons, doped hydrocarbons, such as fluorinated hydrocarbons, amorphous carbon, and diamond-like carbon. In the specification and claims, amorphous carbon and diamond-like carbon are polymer-like material with less hydrogen than regular polymer. Generally, the filler materials may be described as $H_xC_y$, $H_xC_yF_z$, and $H_xC_ySi_z$. More generally, the filler material may be described as any combination of C, H, F and an impurity of Si or other impurities. In this embodiment, the filler material is a polymer material formed by at least one of a spin on, PECVD (plasma-enhanced chemical vapor deposition), and LPCVD (low pressure chemical vapor deposition) process.

Figure 2H:
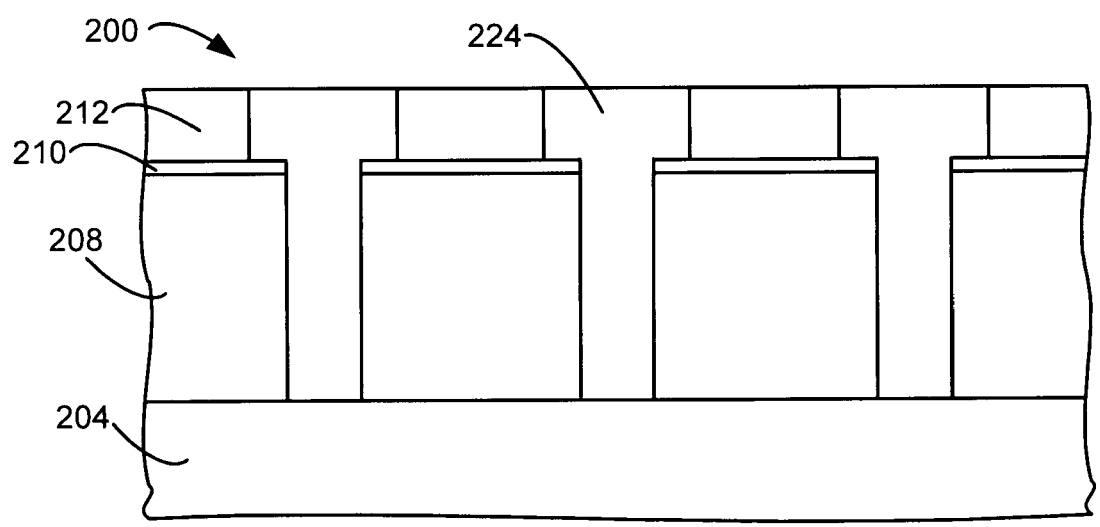

The filler material 224 is planarized (step 132) as shown in FIG. 2H. The planarization may be performed by processes such as chemical mechanical polishing (CMP) or etching back. In this embodiment, the planarization is used to expose the sacrificial layer 212.

In an alternative embodiment, a cyclical process of deposition and shaping phases may be used to fill the features with a filler material, planarize, and expose the sacrificial layer in a single step. Other processes may be used to replace steps 128 and 132 with a single step.

Figure 2I:
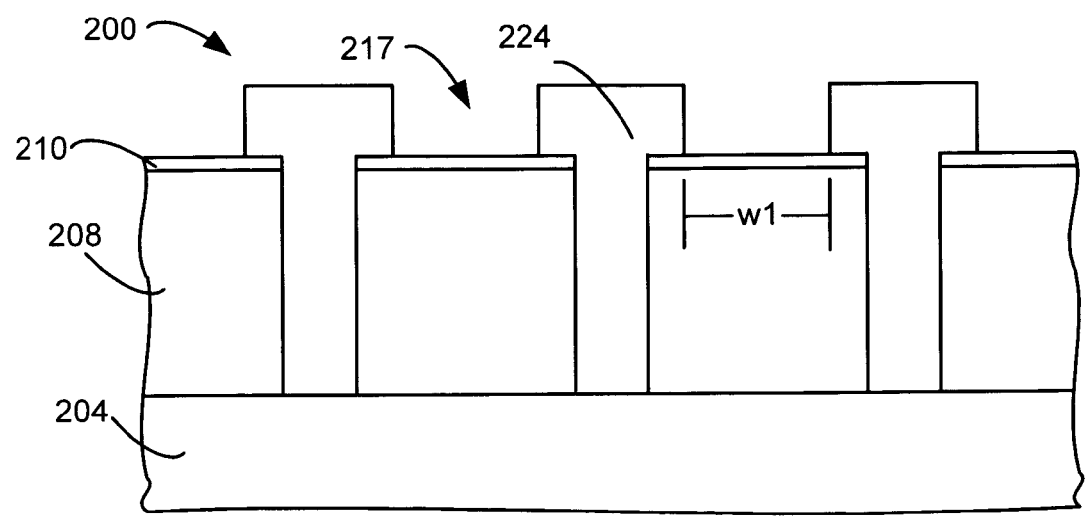

The sacrificial layer is removed (step 136), as shown in FIG. 2I. The planarization of the filler material 224 to expose the sacrificial layer 212 allows for the removal of the sacrificial layer. A selective etch process may be used to selectively remove the sacrificial layer without removing the filler material 224. A processing chamber 400, as shown in FIG. 4, may be used to accomplish this. In this example, a hydrogen fluoride (HF) wet etch (dip) is used to remove the silicon oxide sacrificial layer.

As a result of the removal of the sacrificial layer, parts of the filler material 224 extend above the surface of the dielectric layer 208, where spaces 217 are formed between the parts of the filler material 224 that extend above the surface of the dielectric layer 208, where the spaces 217 are in the area formerly occupied by the sacrificial layer. The spaces 217 have widths "w1", as shown in FIG. 2I. To remove the sacrificial layer without removing the filler material 224 or dielectric layer 208, the sacrificial layer must be a material that may be removed without removing the filler material 224 or the dielectric layer 208.

Figure 2J:
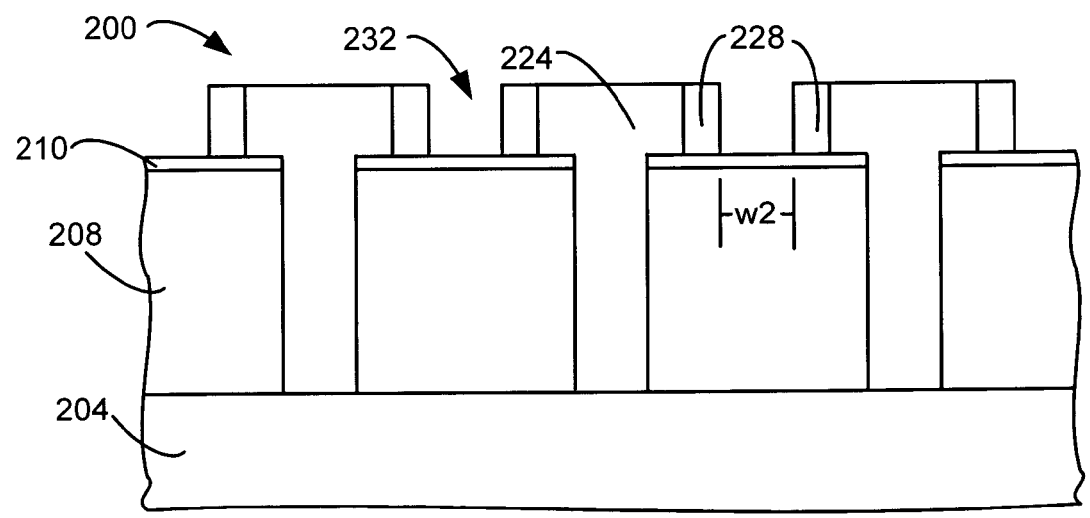

The spaces between the polymer material 224 are shrunk (step 140), as shown in FIG. 2J, by forming shrink sidewalls 228 on the sides walls of the exposed filler material 224 to form reduced spaces 232 with reduced widths "w2". The forming the shrink sidewalls 228 to form reduced spaces may be performed by placing the substrate in a processing chamber. In addition, the shrink process may be a multistep cyclical process, as described above with regard to the previous shrink process.

Figure 2K:
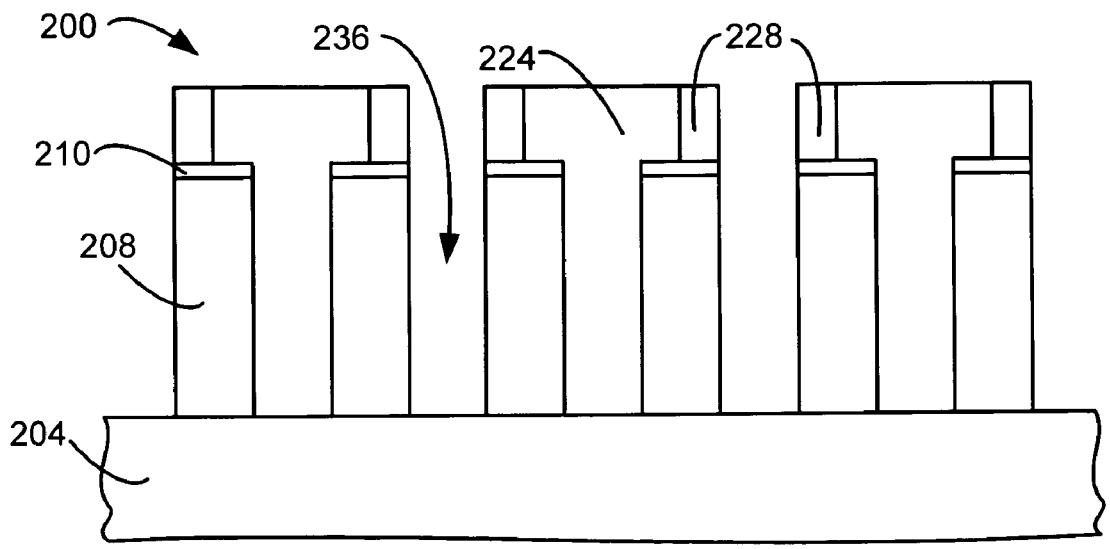

Features 236 of a second set of features are etched into the dielectric layer 208 through the reduced spaces between the shrink sidewalls 228, as shown in FIG. 2K. A conventional etch recipe for etching the dielectric layer 208 is used.

Figure 2L:
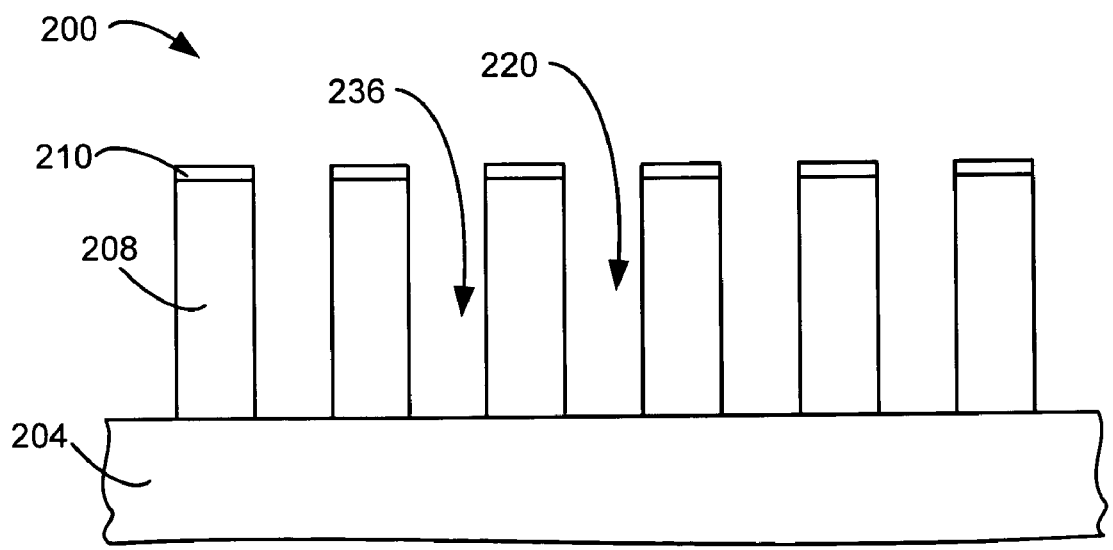

The filler material and shrink sidewall of the filler material are removed (step 148) as shown if FIG. 2L with features 220 of a first set of features and features 236 of a second set of features.

The table below provides various combinations of sacrificial layer materials and filler materials. Duo is a hydrocarbon material with silicon. The organic polymer may be amorphous carbon, photoresist, or bottom antireflective coating (BARC). The combinations allow the sacrificial layer to be selectively removed with respect to the filler material and dielectric layer using either a plasma etch or wet strip and the filler material to be selectively removed with respect to the dielectric layer using an oxidizing, reducing, or wet strip.

| Sacrificial materials | Filler materials |
|---|---|
| SiN | Organic Polymer, SOG or TEOS |
| a-Si | Organic Polymer |
| TEOS | Organic Polymer |
| Duo | Organic Polymer |
| SiC | Organic Polymer |
| a-Si | Duo |
| TiN | Organic Polymer, SOG, or TEOS |
| TaN | Organic Polymer, SOG, or TEOS |

SOG is spin-on-glass.

In this example, an $O_2$ plasma strip is used to remove the polymer filler material.

Figure 6:
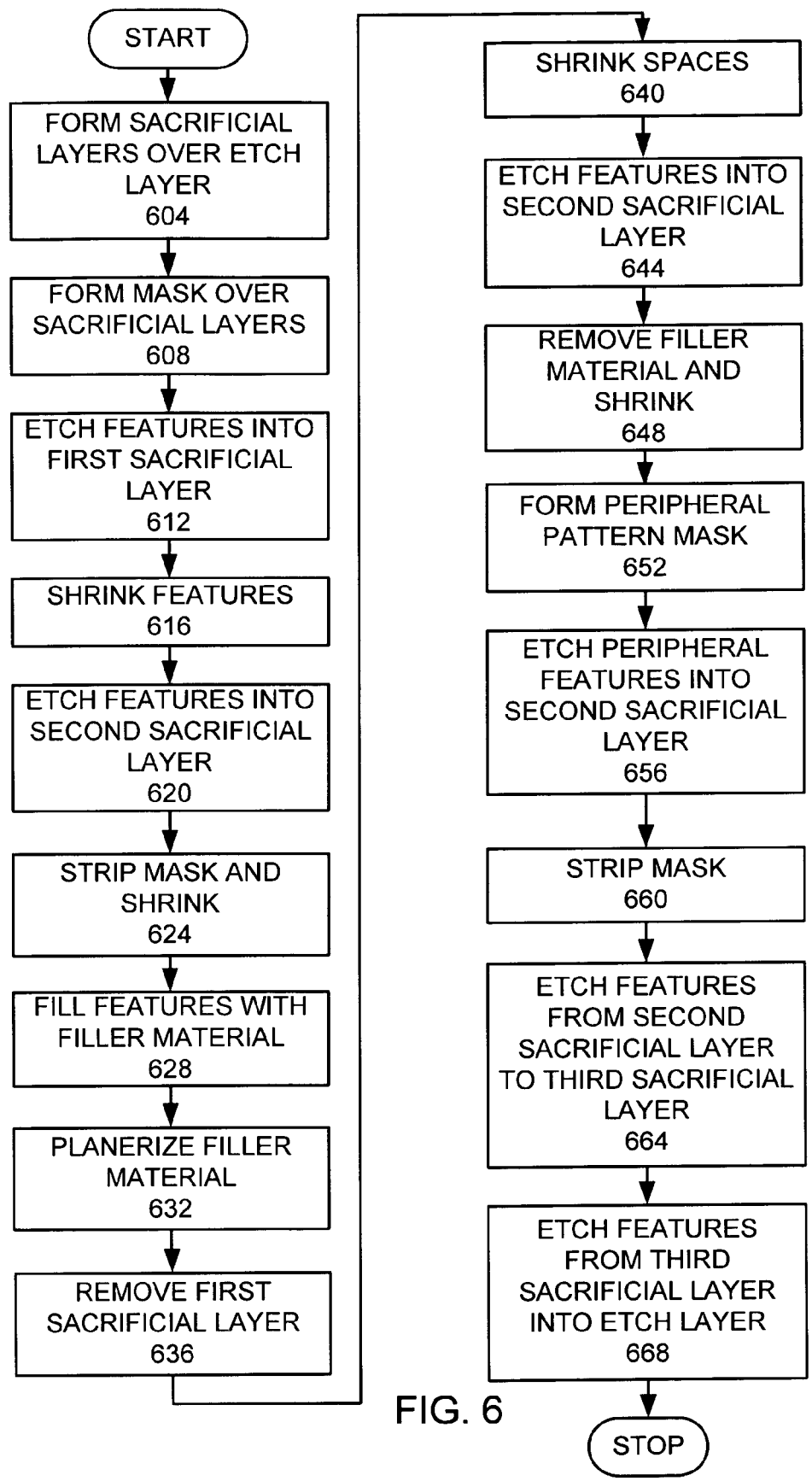
FIG. 6 is a flow chart of another embodiment of the invention.
Figure 7A:
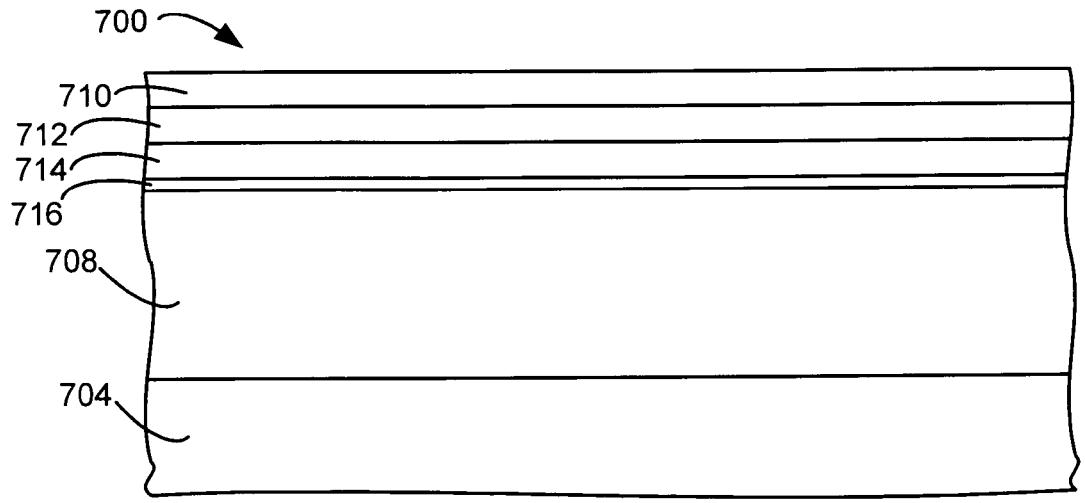
FIGS. 7A-O are schematic cross-sectional and top views of a stack processed according to an embodiment of the invention.

Line and Peripheral Layout Example:

To facilitate understanding, FIG. 6 is a flow chart of another embodiment of the invention that uses three hardmask layers and provides a memory cell line pattern and a peripheral region pattern. Sacrificial layers are formed over an etch layer (step 604). FIG. 7A is a cross-sectional view of a first sacrificial layer 710, a second sacrificial layer 712, and a third sacrificial layer 714 formed over an etch layer 708, which is over a substrate 704 forming a stack 700. In this example, the substrate 704 is a silicon wafer. An etch stop layer 716 is disposed between the third sacrificial layer 714 and etch layer 708. In this example, the etch stop layer 716 is at least one of a nitride and silicon carbide. In other examples, the etch stop layer 716 may be of other materials. The etch layer 708 is a low-k dielectric, such as organosilicate glass. In this embodiment, the first sacrificial layer is SiO, the second sacrificial layer is SiN, and the third sacrificial layer is either SiC or SiO. It is desirable to have the second sacrificial layer different from the first and third sacrificial layer to allow selective etching and removal between adjacent layers. In other embodiments, the sacrificial layers are combinations of SiC, SiN, SiOC, H doped SiOC, TiN, TaN, Ti, Ta, Si, and $SiO_2$. More generally, the sacrificial layer is any combination of material that may be selectively etched or removed with respect to adjacent layers and the filling material, described below.

Figure 7B:
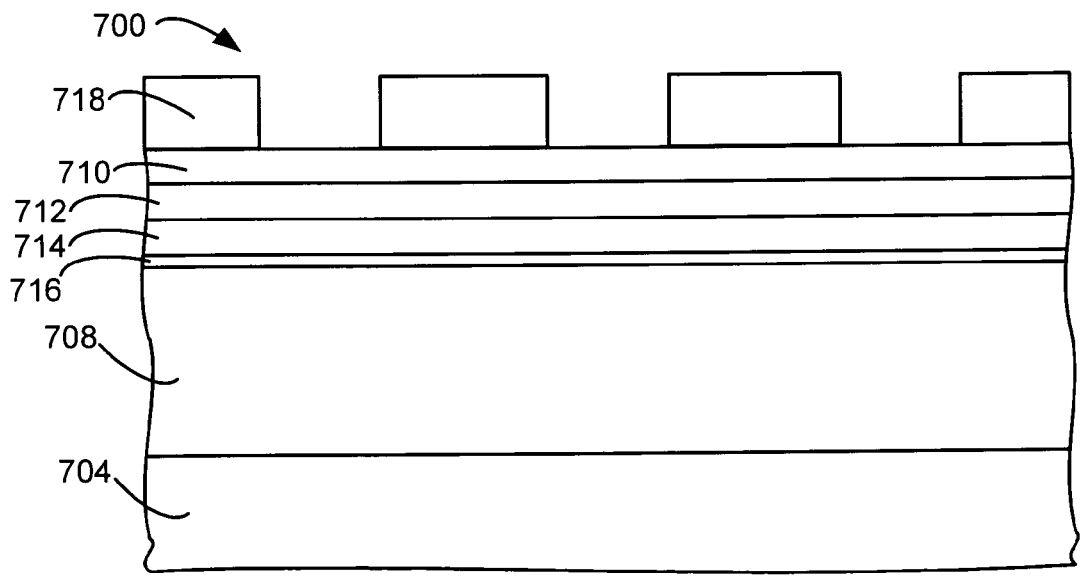
Figure 8A:
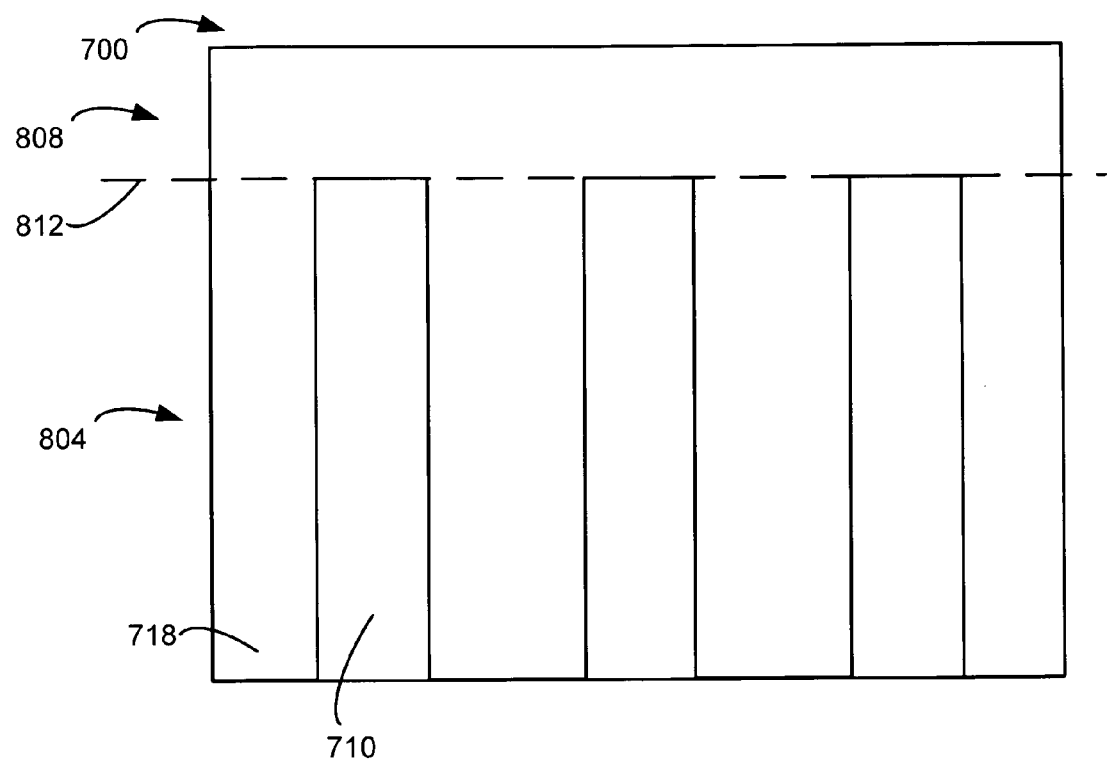
FIGS. 8A-K are schematic partial top view of a stack processed according to an embodiment of the invention.

A memory patterned mask 718 is formed over the first sacrificial layer 710 (step 608), as shown in FIG. 7B. Preferably, the mask 718 is of a photoresist material. FIG. 8A is a top view of part of the stack 700 and substrate showing the mask 718 over the first sacrificial layer 710. The stack 700 forms a memory region 804 and a peripheral region 808, defined by a divide 812. The peripheral region 808 is completely masked by the memory patterned mask 718, so that features will be etched in the memory region but not in the peripheral region.

Figure 7C:
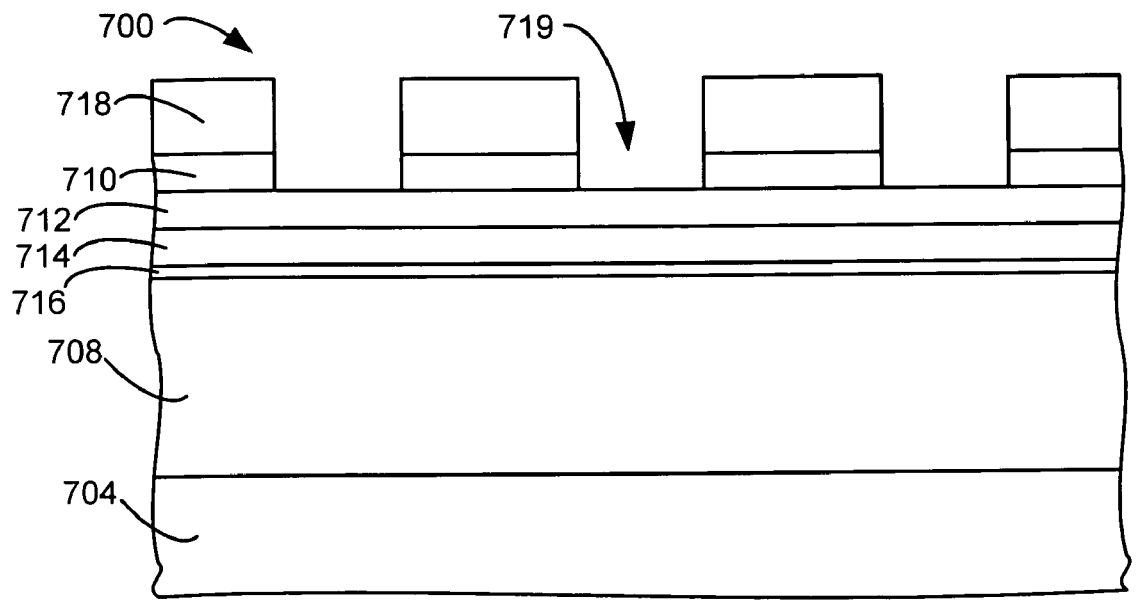
Figure 7D:
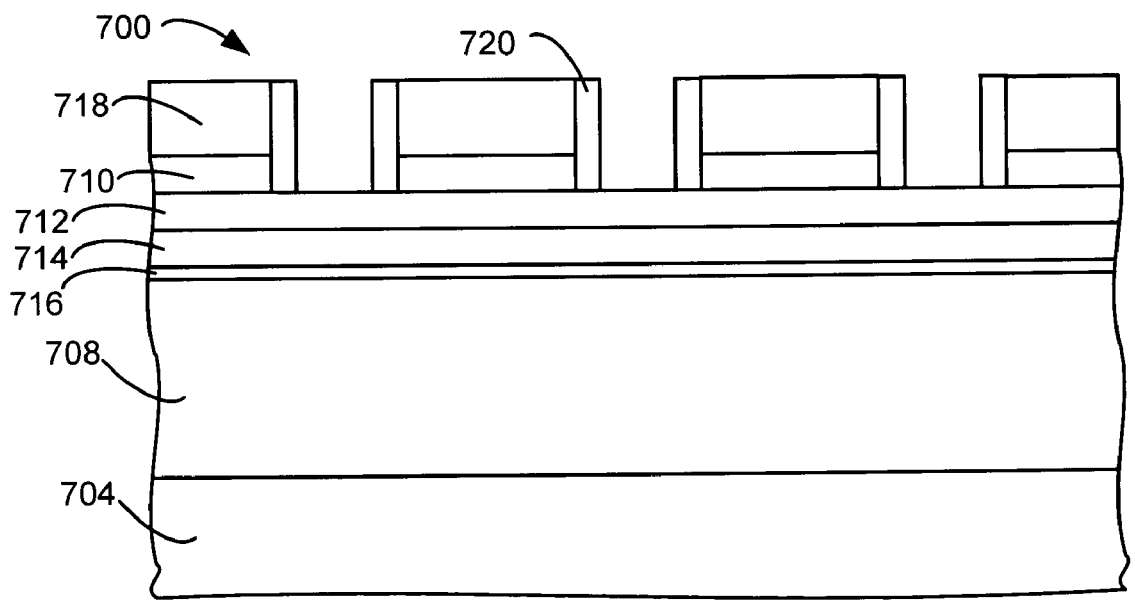

Sacrificial layer features 719 are etched into the first sacrificial layer 710 (step 612), as shown in FIG. 7C. After etching the features 719 into the first sacrificial layer 710, a shrink process is used to shrink widths of the features 719 in the first sacrificial layer 710 by forming sacrificial layer shrink sidewalls 720, as shown in FIG. 7D (step 616).

Figure 7E:
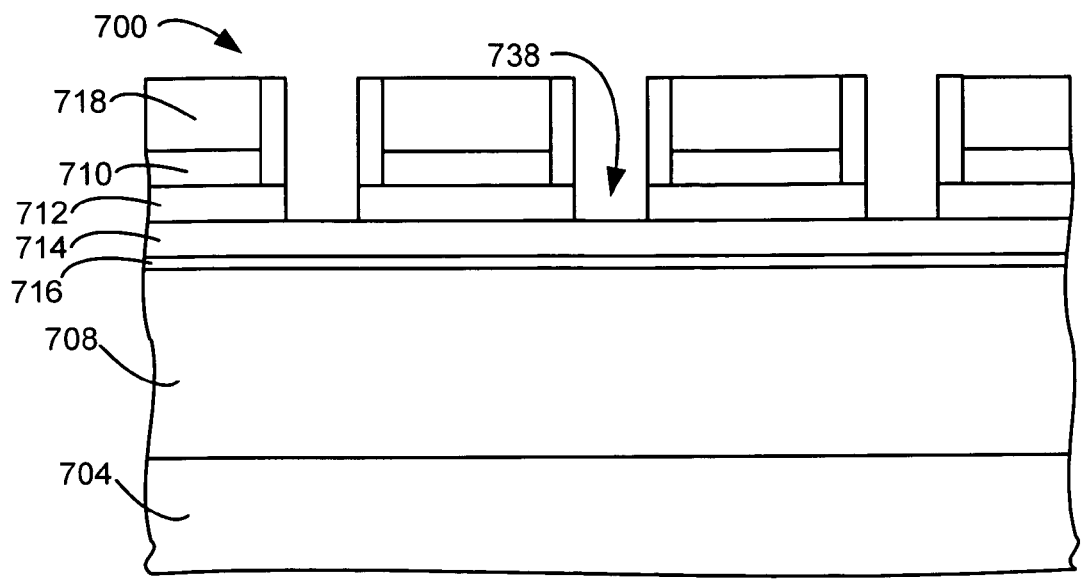
Figure 7F:
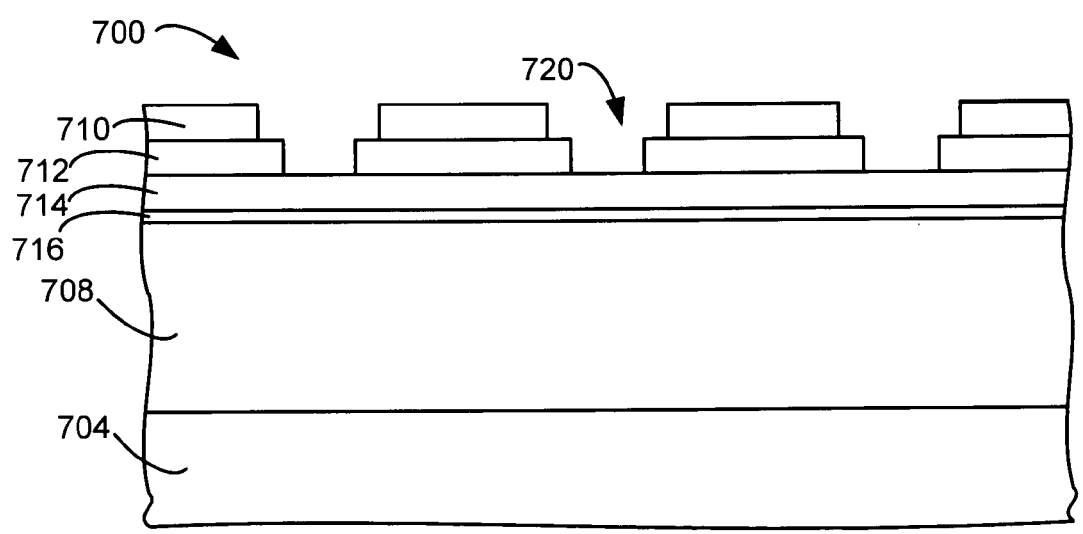
Figure 8B:
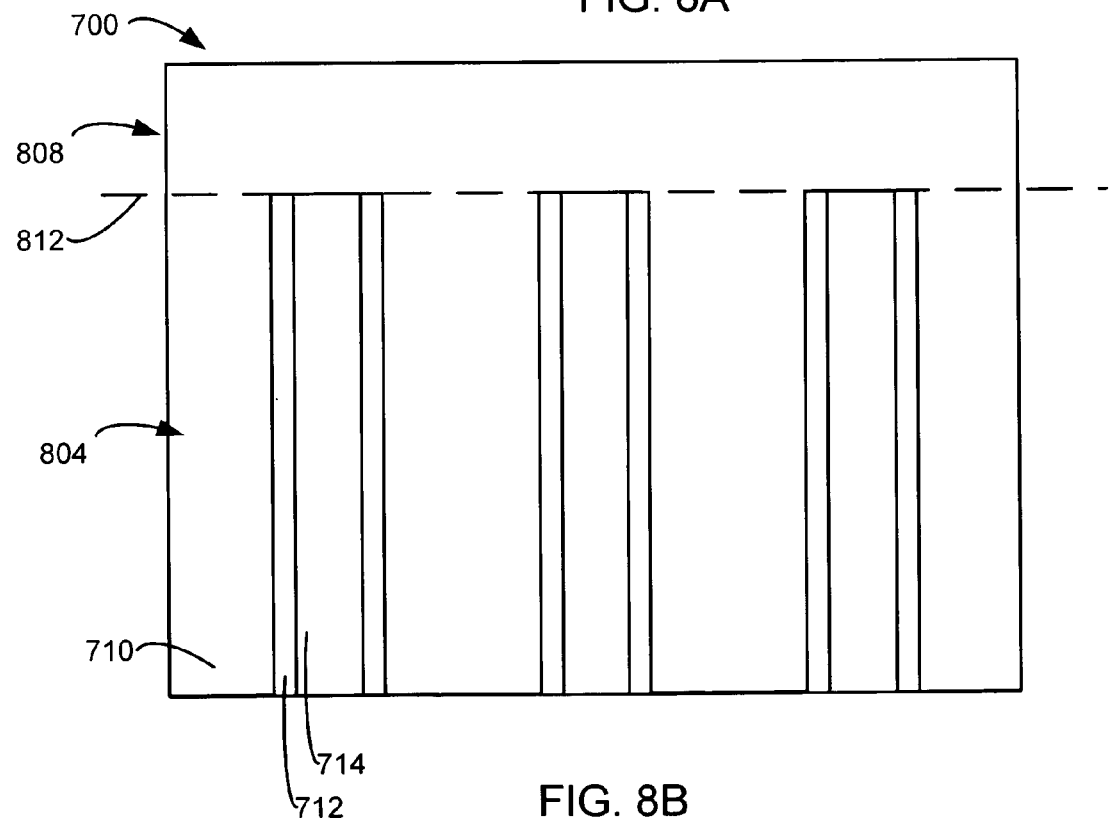

Features 738 are then etched through the shrink sidewalls 720 into the second sacrificial layer 712, as shown in FIG. 7E (step 620). The mask and shrink sidewalls are removed, such as by stripping, as shown in FIG. 7F (step 624). FIG. 8B is a top view of part of the stack 700, shown in FIG. 7F. In this embodiment, the first sacrificial layer 710 in the peripheral region 808 has not been etched, due to the complete masking of the peripheral region 808.

In an alternative embodiment, the memory pattern mask may be used to etch features into the first sacrificial layer and second sacrificial layer, without an intermediate shrink step.

Figure 7G:
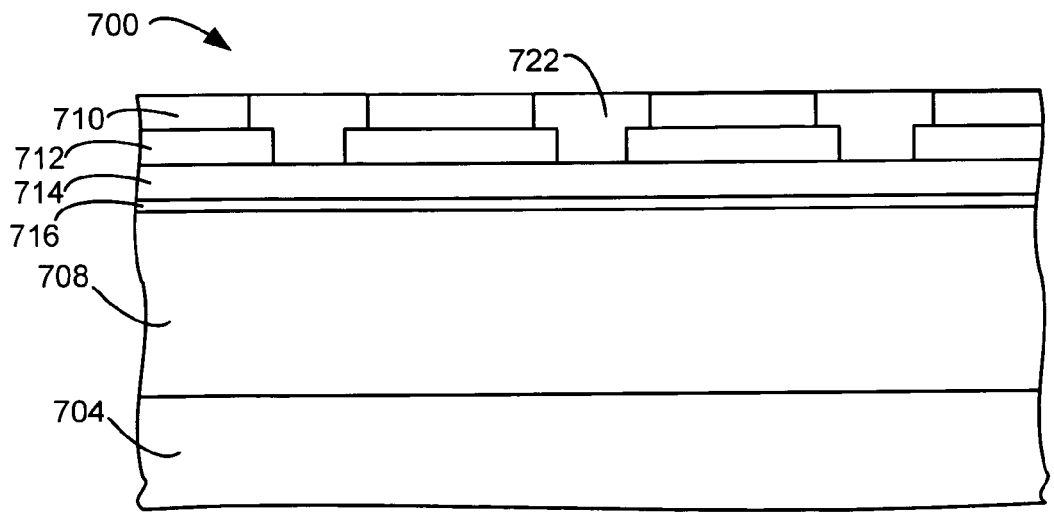

The features are then filled with a filler material 722 (step 628), as shown in FIG. 7G. In this embodiment the filler material is a polymer material, such as photoresist, hydrocarbons, doped hydrocarbons, such as fluorinated hydrocarbons, amorphous carbon, and diamond-like carbon. In the specification and claims, amorphous carbon and diamond-like carbon are polymer-like material with less hydrogen than regular polymer. Generally, the filler materials may be described as $H_xC_y$, $H_xC_yF_z$, and $H_xC_ySi_z$. More generally, the filler material may be described as any combination of C, H, F and an impurity of Si or other impurities. In this embodiment, the filler material is a polymer material formed by at least one of a spin on, PECVD (plasma-enhanced chemical vapor deposition), and LPCVD (low pressure chemical vapor deposition) process.

Figure 8C:
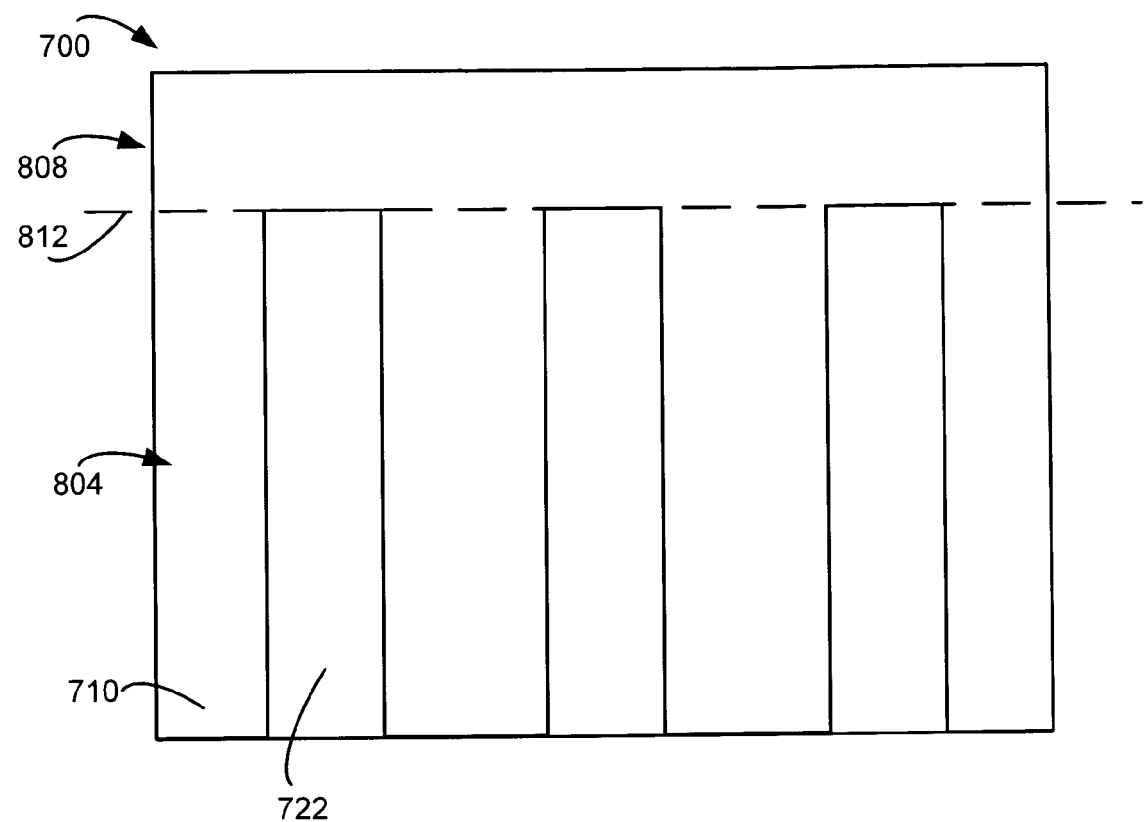

The filler material 722 is planarized (step 632) as shown in FIG. 7G. The planarization may be performed by processes such as chemical mechanical polishing (CMP) or etching back. In this embodiment, the planarization is used to expose the sacrificial layer 710. FIG. 8C is a top view of part of the stack 700, shown in FIG. 7G.

In an alternative embodiment, a cyclical process of deposition and shaping phases may be used to fill the features with a filler material and planarize and expose the sacrificial layer in a single step. Other processes may be used to replace steps 628 and 632 with a single step.

Figure 7H:
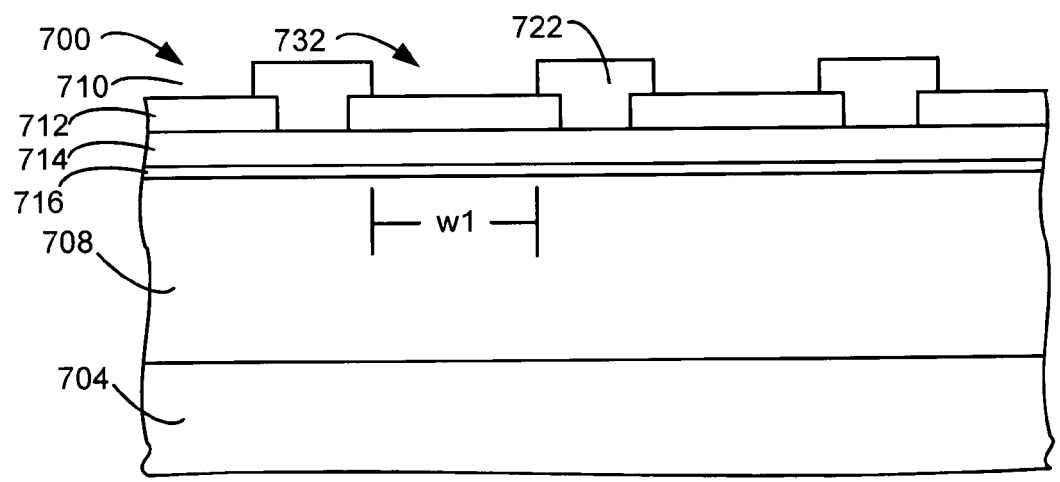
Figure 8D:
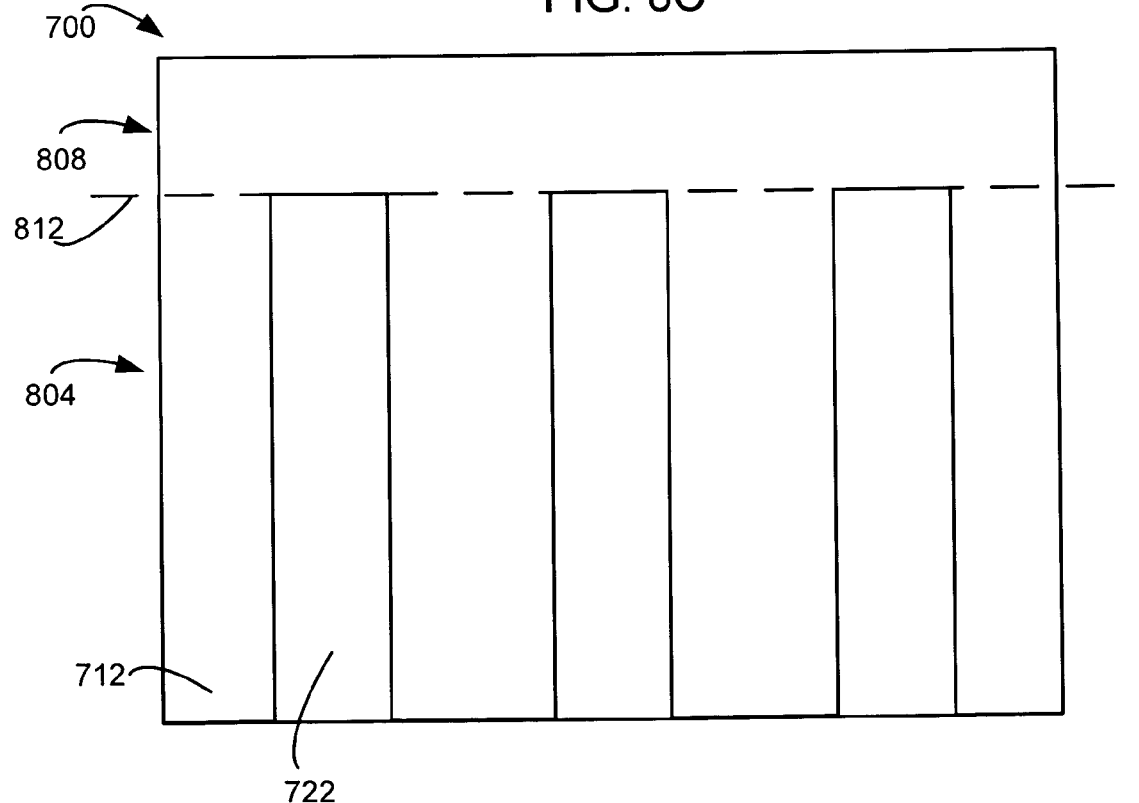

The first sacrificial layer 710 is removed (step 636), as shown in FIG. 7H and FIG. 8D. The planarization of the filler material 722 to expose the first sacrificial layer 710 allows for the removal of the first sacrificial layer 710. A selective etch process may be used to selectively remove the first sacrificial layer without removing the filler material 722. An etch chamber 400, as shown in FIG. 4, may be used to accomplish this. In this example, a hydrogen fluoride (HF) wet etch (dip) is used to remove the silicon oxide sacrificial layer.

As a result of the removal of the first sacrificial layer 710, parts of the filler material 722 extend above the surface of the stack 700, where spaces 732 are formed between the parts of the filler material 722 that extend above the surface of the stack 700, where the spaces 732 are in the area formerly occupied by the first sacrificial layer 710. The spaces 732 have widths "w1", as shown in FIG. 7H. To remove the first sacrificial layer without removing the filler material 722 or second sacrificial layer 712, the first sacrificial layer 710 must be a material that may be removed without removing the filler material 722 or the second sacrificial layer 712.

Figure 7I:
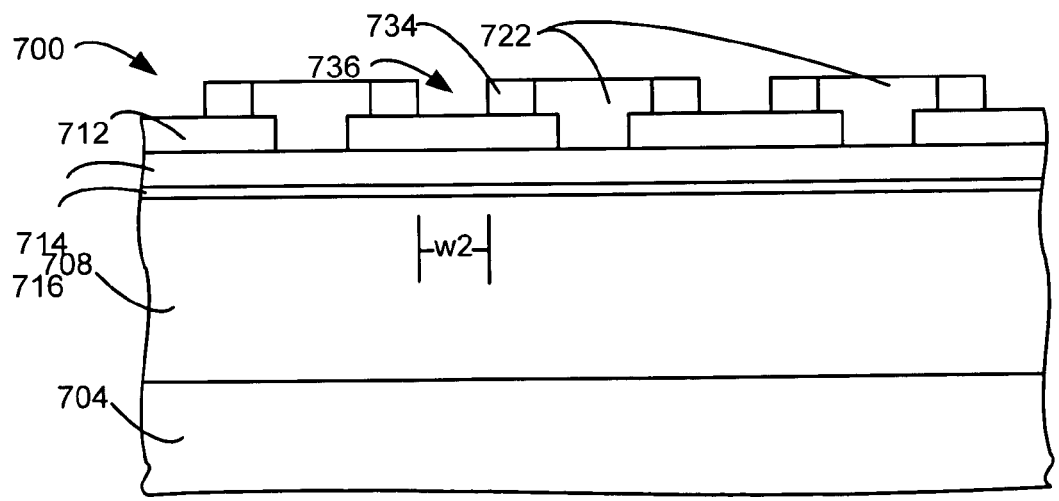
Figure 8E:
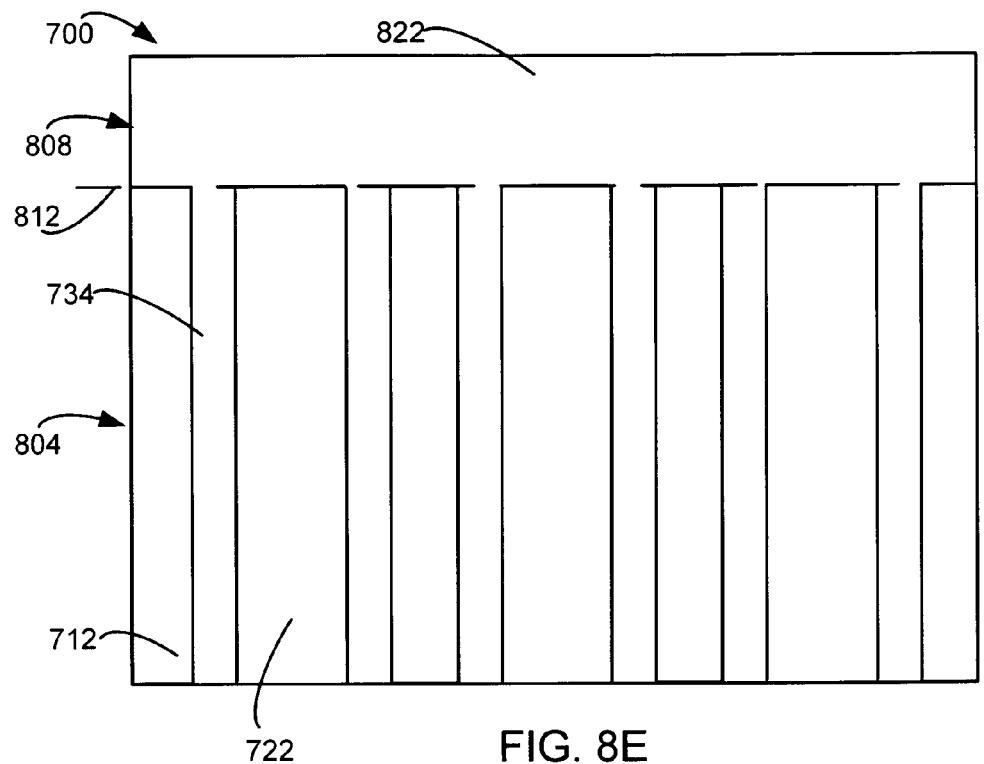

The spaces between the filler material 722 are shrunk (step 640), as shown in FIG. 7I and FIG. 8E, by forming shrink sidewalls 734 on the sides walls of the exposed filler material 722 to form reduced spaces 736 with reduced widths "w2". The shrinking of the spaces between the filler material may be performed by placing the substrate in a processing chamber. In addition, the shrink process may be a multistep cyclical process, as described above with regard to the previous shrink process. The use of a multistep shrink process, such as the process shown in FIG. 3, allows for deposition of material on the isolated regions of the peripheral region 808 and selective removal of polymer at the bottom of the features in dense areas in the memory region 804. This selective process provided by the multistep cyclical process deposition thus provides a polymer covering 822 the entire peripheral region 808, while the bottom of features of the memory region has little or preferably no deposition. Preferably, at least two shrink cycles are performed. More preferably, 3-20 shrink cycles are performed.

Figure 7J:
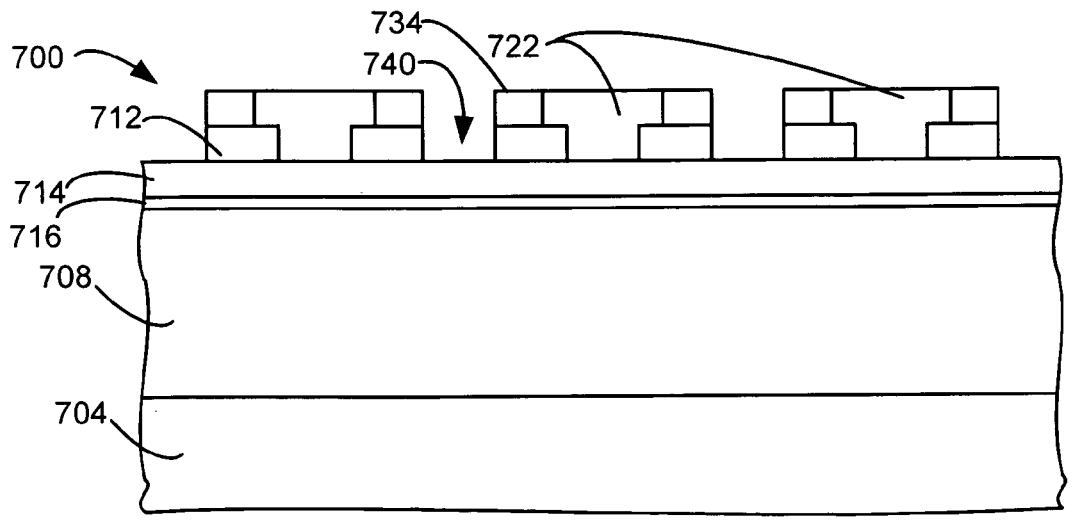
Figure 8F:
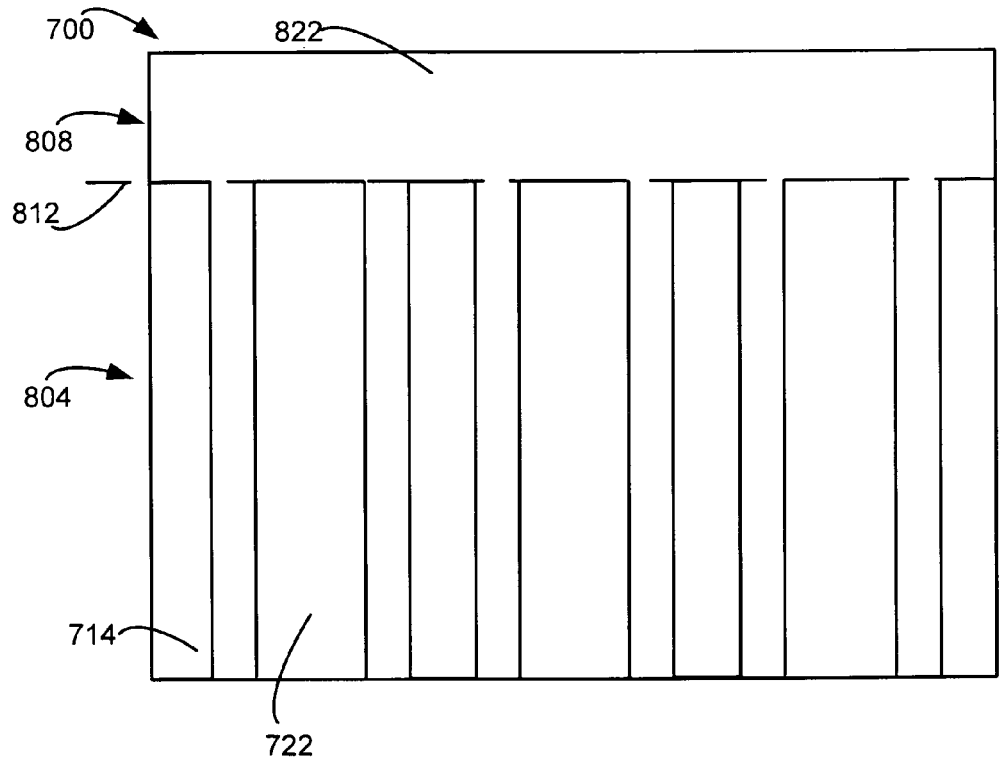

Features 740 of a second set of features are etched into the second sacrificial layer 712 through the reduced space (step 644), as shown in FIG. 7J and FIG. 8F.

Figure 7K:
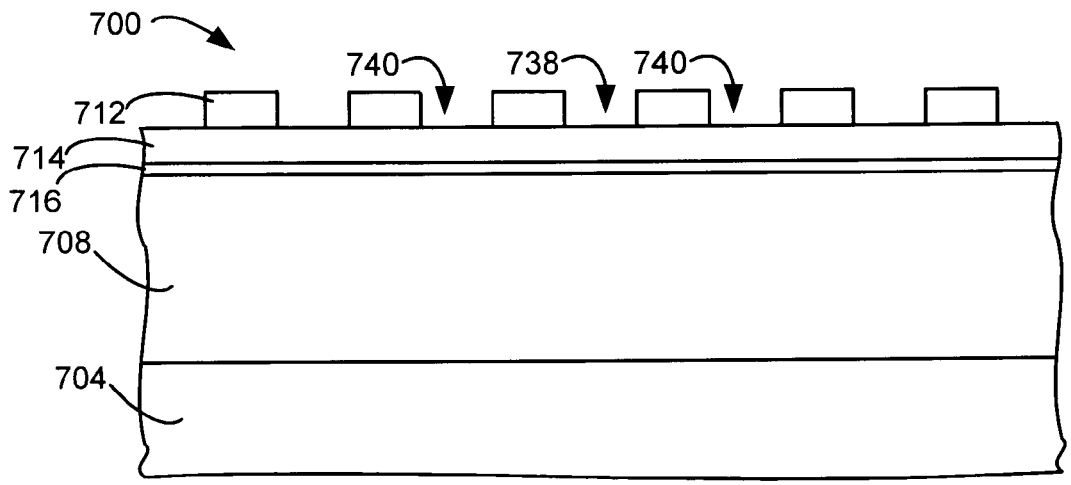
Figure 8G:
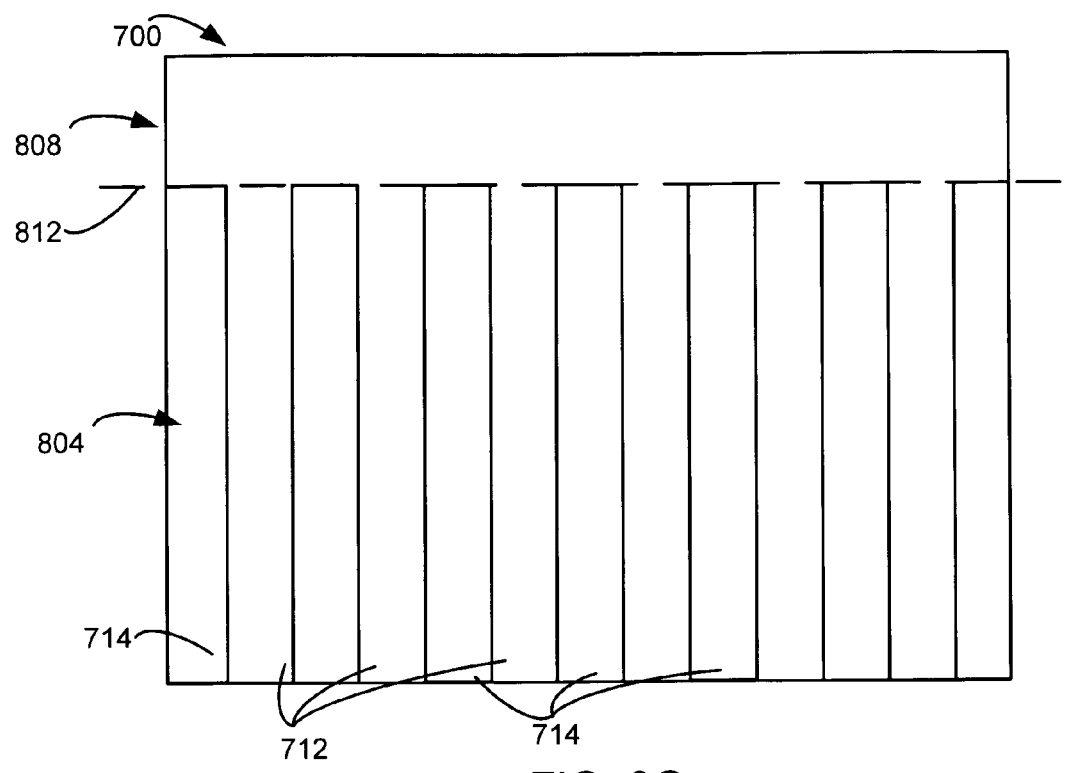

The filler material and shrink sidewall of the filler material are removed (step 648) as shown if FIG. 7K and FIG. 8G with features 738 of a first set of features and features 740 of a second set of features.

Figure 7L:
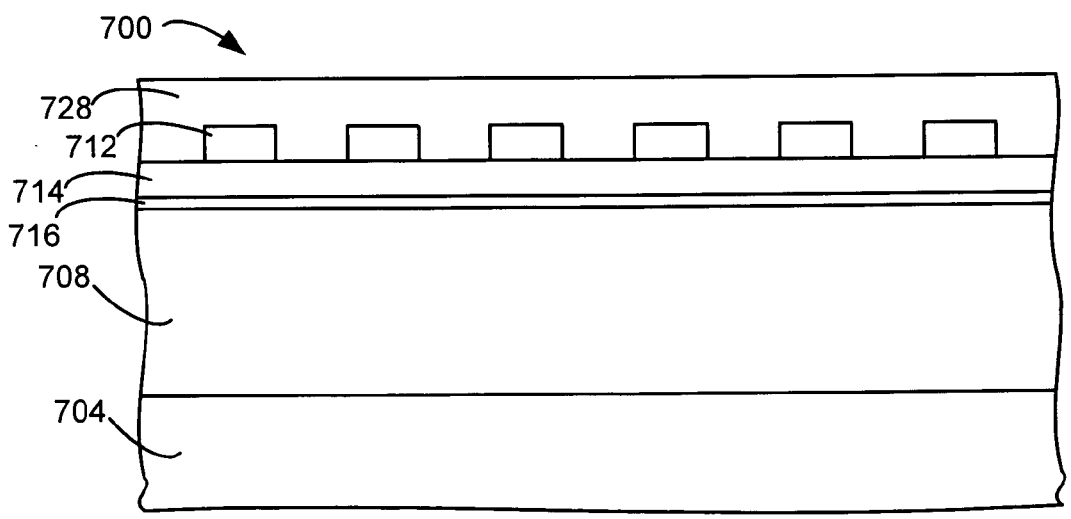
Figure 8H:
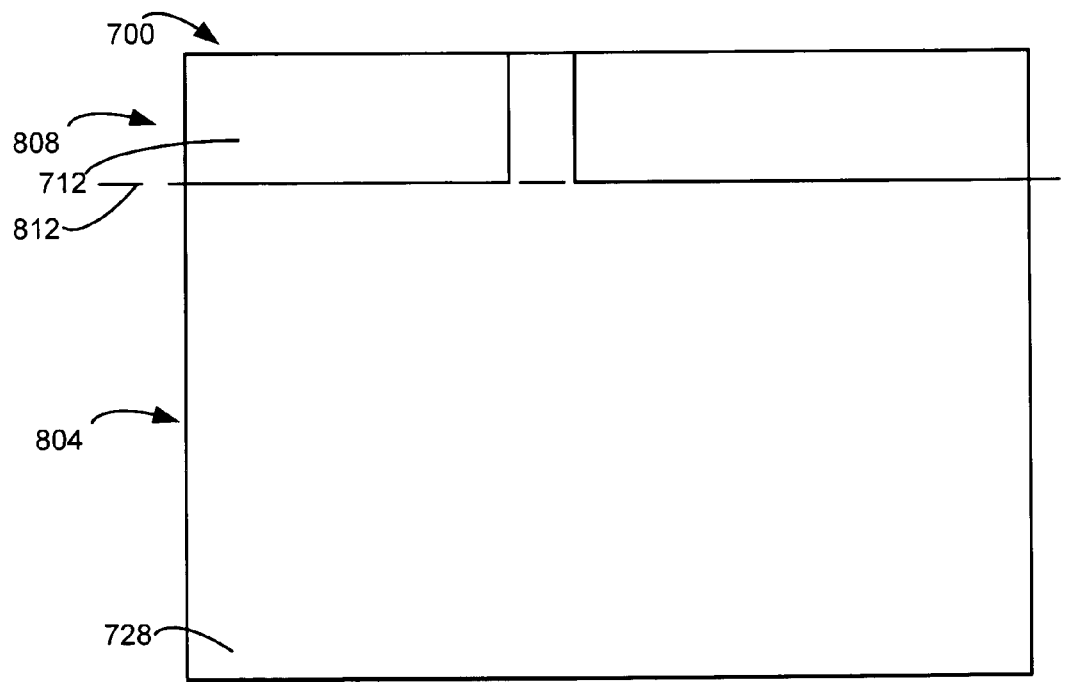

A peripheral pattern mask 728 is formed over the stack 700 (step 652), as shown in FIG. 7L and FIG. 8H. In this embodiment, peripheral pattern mask 728 masks the entire memory region 804, and forms a pattern for a line or device in the peripheral region 808, so that no features will be etched in the memory section but features will be etched into the peripheral region through the peripheral pattern mask.

Figure 7M:
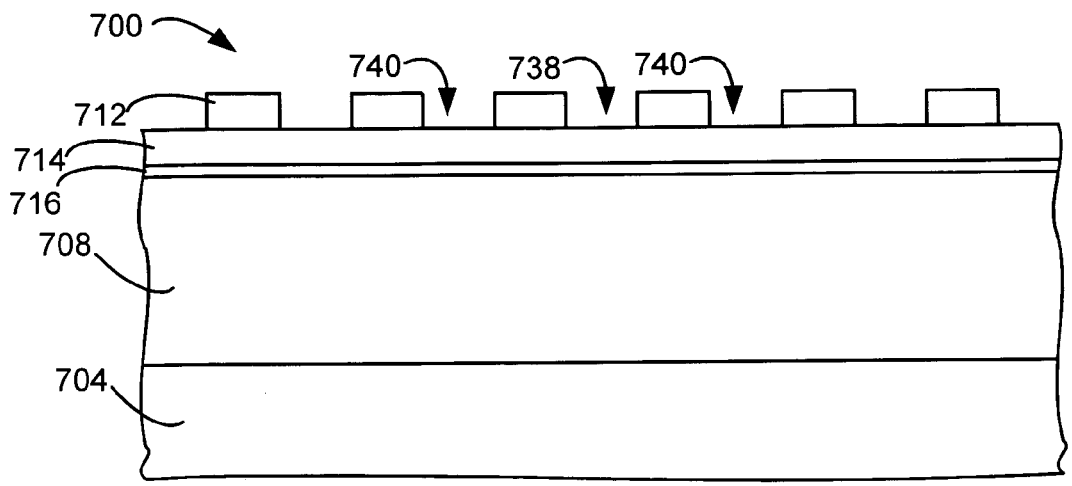
Figure 8I:
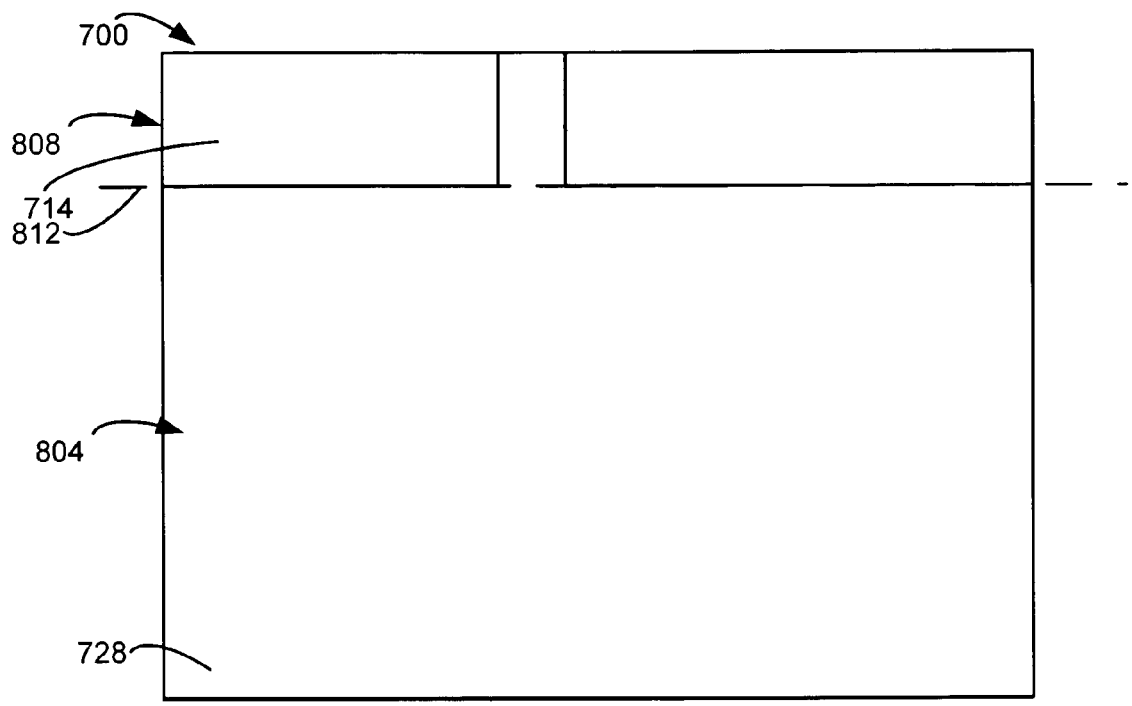
Figure 8J:
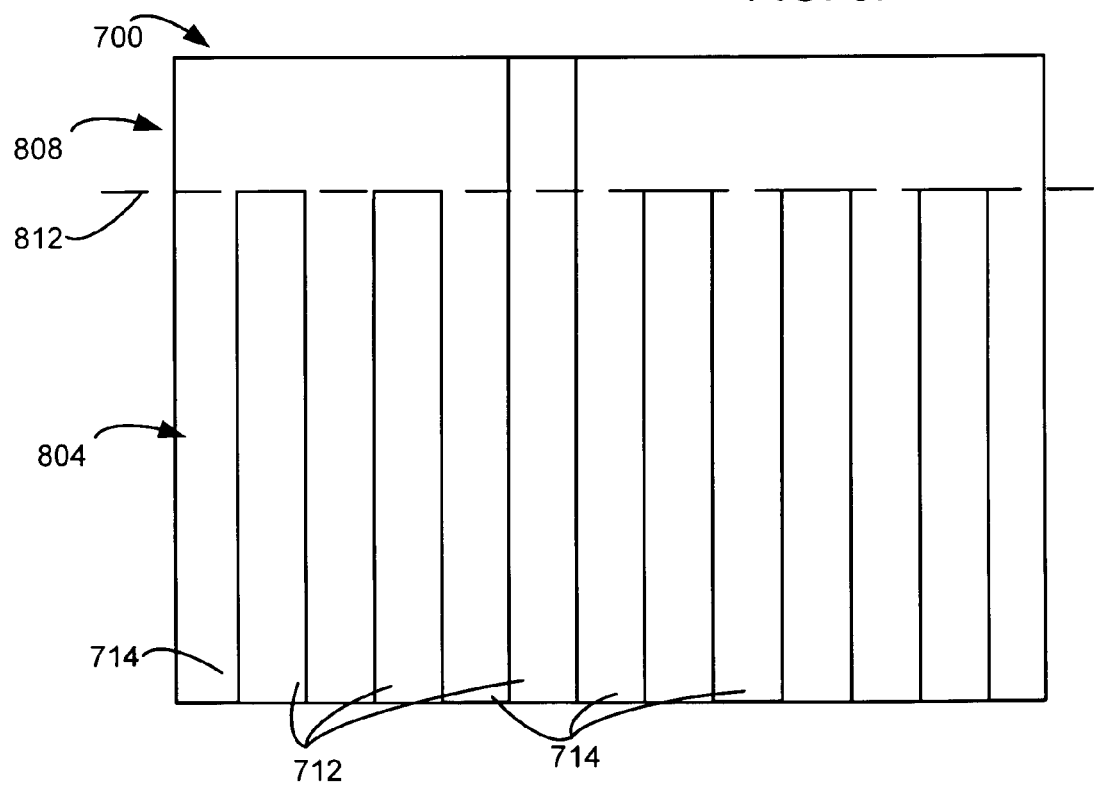

Peripheral features are etched into the second sacrificial layer 712 in the peripheral region (step 656), as shown in FIG. 8I. Because the memory region is masked in this embodiment, the memory region is not etched so that features are not etched into the memory region through the peripheral mask. The mask is stripped (step 660), as shown in FIG. 7M and FIG. 8J.

Figure 7N:
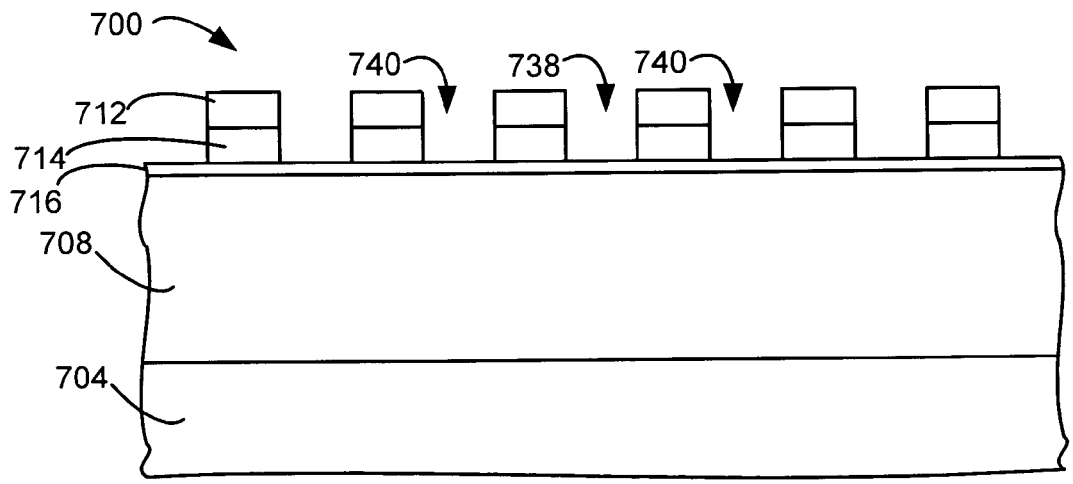
Figure 7O:
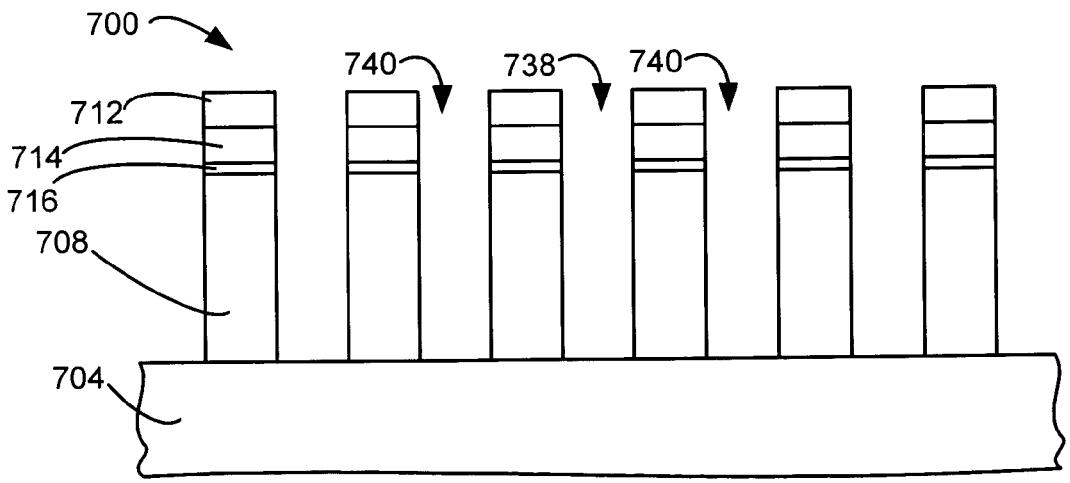
Figure 8K:
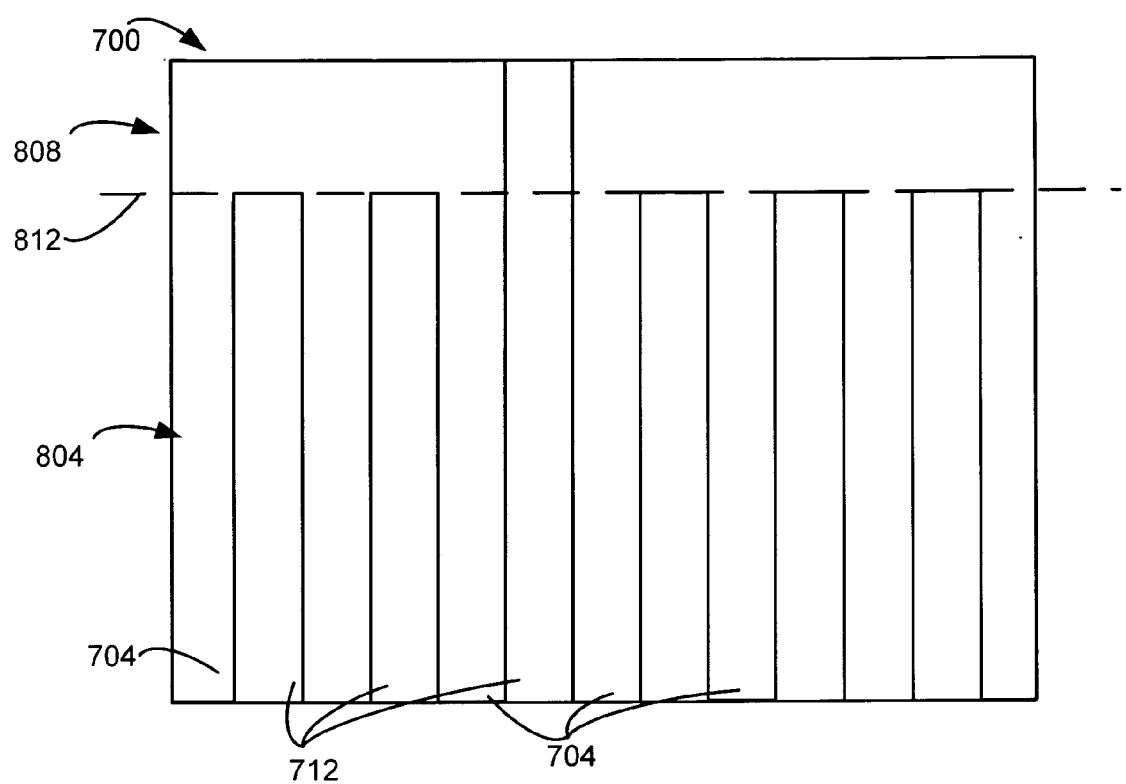

Features are etched from the second sacrificial layer to the third sacrificial layer (step 664), as shown in FIG. 7N. Features are then etched from the third sacrificial layer 714 into the etch layer 708 (step 668), as shown in FIG. 7O and FIG. 8K.

Additional steps, such as filling the features with a conductive material may be provided.

In this example, the third sacrificial layer 714 and an etch stop layer 716 are provided to protect the etch layer 708 during the forming of the mask features. In other embodiments, such as when there is a high selectivity between the second sacrificial layer and the etch layer, the third sacrificial layer and/or the barrier layer may not be needed.

In other embodiments, steps may be omitted or additional steps may be added. For example, shrink after etching features into only the first sacrificial layer may be omitted, if the desired CD is reached with the mask.

This process provides for a less dense pitch in the peripheral region and a higher density pitch in the memory region. In this example, the memory region has features that may be up to twice as dense as the peripheral region. With additional masking processes, using the invention, the memory region may have a feature density at least three times greater than the density of features of the peripheral region.

This process provides etched features with half the CD and half the pitch of features formed using the same photoresist mask using a conventional etch process. This process allows the use of a single photoresist mask to halve the pitch, while providing an automatic alignment between the first set of features and the second set of features.

Some of the steps in the above preferred embodiment may be omitted or changed without increasing CD and/or increasing the pitch. Other steps in the preferred embodiment may be omitted or changed, but which still reduces the CD and/or reduces pitch with respect to conventional processes.

In other embodiments, the process is repeated using additional masks to further reduce CD and reduce the pitch. For an example, a second mask may be used for another half pitch reduction.

In this example, the etch layer may be a dielectric etch layer, a conductive etch layer, or a semiconductor etch layer.

While this invention has been described in terms of several preferred embodiments, there are alterations, modifications, permutations, and various substitute equivalents, which fall within the scope of this invention. It should also be noted that there are many alternative ways of implementing the methods and apparatuses of the present invention. It is therefore intended that the following appended claims be interpreted as including all such alterations, modifications, permutations, and various substitute equivalents as fall within the true spirit and scope of the present invention.

What is claimed is:

1. A method for providing features in an etch layer with a memory region and a peripheral region, where a density of features in the memory region is at least twice a density of features in the peripheral region, comprising:
    forming first and second sacrificial layers over the etch layer;
    forming a memory patterned mask over the sacrificial layer, where the memory patterned mask provides features over memory region;
    etching a first set of sacrificial layer features into the first sacrificial layer and the second sacrificial layer, where the first set of sacrificial layer features are in the memory region;
    filling features of the first set of sacrificial layer features with filler material;
    removing the first sacrificial layer, so that parts of the filler material remain exposed above a surface of the second sacrificial layer, wherein spaces are between the exposed parts of the filler material, where the spaces are in an area formerly occupied by the first sacrificial layer, wherein the spaces have widths;
    shrinking the widths of the spaces between the parts of the filler material with a shrink sidewall deposition where the shrink sidewall deposition provides a deposition over the memory region;
    etching a second set of sacrificial layer features into the second sacrificial layer through the shrink sidewall deposition, where the second set of sacrificial layer features are only in the memory region and not in the peripheral region;
    removing the filler material and shrink sidewall deposition;
    forming a peripheral patterned mask over the memory region and peripheral region, where features are provided over the peripheral region;
    etching the second sacrificial layer through the peripheral patterned mask, wherein features are etched into the second sacrificial layer in the peripheral region;
    removing the peripheral patterned mask; and
    etching features into the etch layer from the second sacrificial layer.

2. The method, as recited in claim 1, wherein the shrinking the widths of the spaces comprises at least one shrink cycle, wherein each shrink cycle comprises:
    a shrink deposition phase, which forms deposits on sidewalls of the filler material to shrink the spaces; and
    a shrink profile shaping phase, which shapes the deposition on the sidewalls of the filler material.

3. The method, as recited in claim 1, wherein the shrinking the widths of the spaces comprises at least three shrink cycles, wherein each shrink cycle comprises:
    a shrink deposition phase, which forms deposits on sidewalls of the filler material to shrink the spaces; and
    a shrink profile shaping phase, which shapes the deposition on the sidewalls of the filler material.

4. The method, as recited in claim 3, wherein the memory patterned mask does not provide features over the peripheral region and wherein the peripheral patterned mask does not provide features over the memory region, and wherein the etching the first set of sacrificial layer features does not etch features in the peripheral region.

5. The method, as recited in claim 4, wherein the shrink deposition phase comprises:
    providing a deposition gas;
    forming a plasma from the deposition gas; and
    stopping the flow of the deposition gas.

6. The method, as recited in claim 5, wherein the shrink profile shaping phase comprises:
    providing a profile shaping gas different than the deposition gas;
    forming a plasma from the profile shaping gas; and
    stopping the flow of the profile shaping gas.

7. The method, as recited in claim 6, wherein the deposition gas comprises at least one of a hydrocarbon, fluorocarbon, and hydrofluorocarbon and the profile shaping gas comprises at least one of $C_xF_y$, $NF_3$, and $C_xH_yF_z$.

8. The method, as recited in claim 6, wherein the etching a first set of sacrificial layer features into the first sacrificial layer and the second sacrificial layer, comprises:
    etching the features into the first sacrificial layer;
    shrinking the features etched into the first sacrificial layer with a shrink deposition; and
    etching the first set of sacrificial layer features into the second sacrificial layer through the shrink deposition.

9. The method, as recited in claim 8, further comprising removing the shrink deposition after etching the first set of sacrificial layer features.

10. The method, as recited in claim 9, wherein the removing the shrink deposition is before filling the first set of sacrificial layer features with the filler material.

11. The method, as recited in claim 10, further comprising planarizing the filler material.

12. The method, as recited in claim 11, wherein the etching features into the etch layer through the second sacrificial layer, comprises:
   etching feathers into a third sacrificial layer through the second sacrificial layer; and
   etching features into the etch layer through the third sacrificial layer.

13. The method, as recited in claim 11, wherein the shrinking the sacrificial layer features comprises at least one shrink cycle, wherein each shrink cycle comprises:
   a sacrificial layer features shrink deposition phase, which forms deposits on sidewalls of the sacrificial layer to shrink the sacrificial layer features; and
   a sacrificial layer features shrink profile shaping phase, which shapes the deposition on the sidewalls of the sacrificial layer features.

14. The method, as recited in claim 13 wherein the sacrificial layer features shrink deposition phase comprises:
   providing a deposition gas;
   forming a plasma from the deposition gas; and
   stopping the flow of the deposition gas.

15. The method, as recited in claim 14, wherein the sacrificial layer features shrink profile shaping phase comprises:
   providing a profile shaping gas, which is different than the deposition gas;
   forming a plasma from the profile shaping gas; and
   stopping the flow of the profile shaping gas.

16. A semiconductor device formed by the method of claim 1.

17. A method for providing features in an etch layer with a memory region and a peripheral region, where a density of features in the memory region is at least twice a density of features in the peripheral region, comprising:
   forming first and second sacrificial layers over the etch layer;
   forming a memory patterned mask over the sacrificial layer, where the memory patterned mask provides features over memory region and does not provide features over the peripheral region;
   etching a first set of sacrificial layer features into the first sacrificial layer and the second sacrificial layer, where the first set of sacrificial layer features are in the memory region;
   filling features of the first set of sacrificial layer features with filler material;
   removing the first sacrificial layer, so that parts of the filler material remain exposed above a surface of the second sacrificial layer, wherein spaces are between the exposed parts of the filler material, where the spaces are in an area formerly occupied by the first sacrificial layer, wherein the spaces have widths;
   shrinking the widths of the spaces between the parts of the filler material with a shrink sidewall deposition where the shrink sidewall deposition provides a deposition over the memory region, wherein the shrinking the widths of the spaces comprises at least two shrink cycles, wherein each shrink cycle comprises:
      a shrink deposition phase, which forms deposits on sidewalls of the filler material to shrink the spaces; and
      a shrink profile shaping phase, which shapes the deposition on the sidewalls of the filler material;
   etching a second set of sacrificial layer features into the second sacrificial layer through the shrink sidewall deposition, where the second set of sacrificial layer features are only in the memory region and not in the peripheral region;
   removing the filler material and shrink sidewall deposition;
   forming a peripheral patterned mask over the memory region and peripheral region, where features are provided over the peripheral region and where features are not provided over the memory region;
   etching the second sacrificial layer through the peripheral patterned mask, wherein features are etched into the second sacrificial layer in the peripheral region;
   removing the peripheral patterned mask; and
   etching features into the etch layer from the second sacrificial layer.

18. The method, as recited in claim 17, wherein the shrink deposition phase comprises:
   providing a deposition gas;
   forming a plasma from the deposition gas; and
   stopping the flow of the deposition gas, and wherein the shrink profile shaping phase comprises:
      providing a profile shaping gas different than the deposition gas;
      forming a plasma from the profile shaping gas; and
      stopping the flow of the profile shaping gas.

19. A method for providing features in an etch layer with a memory region and a peripheral region, where a density of features in the memory region is at least twice a density of features in the peripheral region, comprising:
   forming first and second sacrificial layers over the etch layer;
   forming a memory patterned mask over the sacrificial layer, where the memory patterned mask provides features over memory region and does not provide features over the peripheral region;
   etching the features into the first sacrificial layer;
   shrinking the features etched into the first sacrificial layer with a shrink deposition;
   etching the first set of sacrificial layer features into the second sacrificial layer through the shrink deposition;
   filling features of the first set of sacrificial layer features with filler material;
   removing the first sacrificial layer, so that parts of the filler material remain exposed above a surface of the second sacrificial layer, wherein spaces are between the exposed parts of the filler material, where the spaces are in an area formerly occupied by the first sacrificial layer, wherein the spaces have widths;
   shrinking the widths of the spaces between the parts of the filler material with a shrink sidewall deposition where the shrink sidewall deposition provides a deposition over the memory region, wherein the shrinking the widths of the spaces comprises at least two shrink cycles, wherein each shrink cycle comprises:
      a shrink deposition phase, which forms deposits on sidewalls of the filler material to shrink the spaces; and
      a shrink profile shaping phase, which shapes the deposition on the sidewalls of the filler material;
   etching a second set of sacrificial layer features into the second sacrificial layer through the shrink sidewall deposition, where the second set of sacrificial layer features are only in the memory region and not in the peripheral region;
   removing the filler material and shrink sidewall deposition;
   forming a peripheral patterned mask over the memory region and peripheral region, where features are provided over the peripheral region and where features are not provided over the memory region;
   etching the second sacrificial layer through the peripheral patterned mask, wherein features are etched into the second sacrificial layer in the peripheral region;
   removing the peripheral patterned mask; and
   etching features into the etch layer from the second sacrificial layer.

* * * * *